(12) United States Patent
Sugiura et al.

(10) Patent No.: US 8,604,821 B2
(45) Date of Patent: Dec. 10, 2013

(54) POWER SUPPLY VOLTAGE MONITORING CIRCUIT AND ELECTRONIC CIRCUIT INCLUDING THE POWER SUPPLY VOLTAGE MONITORING CIRCUIT

(75) Inventors: Masakazu Sugiura, Chiba (JP); Atsushi Igarashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 952 days.

(21) Appl. No.: 12/686,684

(22) Filed: Jan. 13, 2010

(65) Prior Publication Data
US 2010/0176839 A1 Jul. 15, 2010

(30) Foreign Application Priority Data
Jan. 13, 2009 (JP) .................. 2009-005214

(51) Int. Cl.
*G01R 31/40* (2006.01)
(52) U.S. Cl.
USPC ...................... 324/764.01; 324/537
(58) Field of Classification Search
None
See application file for complete search history.

(56) References Cited

U.S. PATENT DOCUMENTS

| | | | |
|---|---|---|---|
| 6,713,992 B2 * | 3/2004 | Matsuo et al. | 323/266 |
| 6,744,295 B2 | 6/2004 | Miyagi | |
| 6,970,334 B1 * | 11/2005 | Smith et al. | 361/18 |
| 7,138,851 B2 * | 11/2006 | Sumita et al. | 327/534 |
| 7,148,742 B2 * | 12/2006 | Pan et al. | 327/539 |
| 7,301,409 B2 * | 11/2007 | Uchiyama et al. | 331/57 |
| 7,372,309 B2 * | 5/2008 | Ohtake | 327/142 |
| RE41,304 E * | 5/2010 | Matsuo et al. | 323/266 |
| 8,004,254 B2 * | 8/2011 | Agari et al. | 323/266 |
| 8,183,907 B2 * | 5/2012 | Sugiura et al. | 327/365 |
| 8,339,188 B1 * | 12/2012 | Silver et al. | 327/538 |
| 2007/0103211 A1 * | 5/2007 | Hsieh | 327/143 |
| 2012/0105132 A1 * | 5/2012 | Sugiura et al. | 327/512 |

FOREIGN PATENT DOCUMENTS

| | | |
|---|---|---|
| JP | 02-108323 A | 4/1990 |
| JP | 06-213941 A | 8/1994 |
| JP | 08-279739 A | 10/1996 |
| JP | 2001-127594 A | 5/2001 |

* cited by examiner

*Primary Examiner* — Richard Isla Rodas
(74) *Attorney, Agent, or Firm* — Brinks Gilson & Lione

(57) ABSTRACT

Provided is a power supply voltage monitoring circuit (50) including: a signal output circuit (1) for outputting a signal voltage (Vsignal) which exhibits a saturation characteristic with respect to an increase in a power supply voltage (VDD); and a signal voltage monitoring circuit (4) for comparing the power supply voltage (VDD) with the signal voltage (Vsignal), and outputting a signal (Vout) indicating that the signal voltage (Vsignal) is normal when there is a predetermined voltage difference. With this configuration, a minimum operating power supply voltage may be reduced in an electronic circuit, and the power supply voltage may be used with efficiency.

8 Claims, 20 Drawing Sheets

INVERTING VOLTAGE LEVEL

POWER SUPPLY VOLTAGE MONITORING CIRCUIT AND ELECTRONIC CIRCUIT INCLUDING THE POWER SUPPLY VOLTAGE MONITORING CIRCUIT

RELATED APPLICATIONS

This application claims priority under 35 U.S.C. §119 to Japanese Patent Application No. 2009-005214 filed on Jan. 13, 2009, the entire content of which is hereby incorporated by reference.

BACKGROUND OF THE INVENTION

1. Field of the Invention

The present invention relates to a power supply voltage monitoring circuit capable of reducing a minimum operating power supply voltage in an electronic circuit so as to allow the electronic circuit to operate at a reduced power supply voltage, and an electronic circuit including the power supply voltage monitoring circuit.

2. Description of the Related Art

For an electronic circuit, an operation-enabled power supply voltage range best suited to the circuit is defined. In the operation-enabled power supply voltage range, proper operation of the circuit is ensured, and therefore the reliability of a signal to be output from the circuit is secured.

When the electronic circuit is turned on, the power supply voltage transiently increases to the operation-enabled power supply voltage, and hence a state transition is effected in which the power supply voltage increases to the operation-enabled power supply voltage. In order to ensure the reliability of a signal to be output during the state transition, the electronic circuit employs a method of controlling and fixing a signal to be output (see, for example, JP 08-279739 A; hereinafter, referred to as Patent Document 1).

An example of the method includes a method of providing a power supply voltage monitoring circuit so as to monitor a power supply voltage to be input, to thereby detect a low power supply voltage state. For example, in the power supply voltage monitoring circuit illustrated in FIG. 1 of Patent Document 1, a power supply voltage to be supplied to the electronic circuit 20 is monitored, and when the power supply voltage becomes equal to or larger than a predetermined set value, an operation-enabled signal is supplied to the electronic circuit 20. With this configuration, the electronic circuit 20 may be prevented from causing malfunction.

The power supply voltage monitoring circuit disclosed in Patent Document 1 includes the power supply voltage detecting circuit as described above, which employs a breeder resistor to detect a power supply voltage. In other words, the power supply voltage monitoring circuit employs an additional circuit for detecting that the power supply voltage becomes equal to or larger than the minimum operating power supply voltage, the additional circuit being different from the circuit to be originally ensured the minimum operating power supply voltage. This configuration is inefficient in a sense that the power supply voltage may not be efficiently used in the electronic circuit.

In other words, the electronic circuit may desirably be configured such that, when a power supply voltage has exceeded the minimum operating power supply voltage in the circuit which needs to be originally ensured the minimum operating power supply voltage, the circuit immediately transmits the information thereon to an external circuit. With this configuration, the minimum operating power supply voltage may be reduced, to thereby reduce the minimum operating power supply voltage requirements in an electronic circuit, such as an integrated circuit (IC).

SUMMARY OF THE INVENTION

The present invention has been made to solve the above-mentioned problem, and therefore it is an object of the invention to provide a power supply voltage monitoring circuit capable of reducing a minimum operating power supply voltage in an electronic circuit so as to use a power supply voltage with efficiency, and an electronic circuit including the power supply voltage monitoring circuit.

In order to solve the above-mentioned problem, the present invention provides a power supply voltage monitoring circuit for monitoring a power supply voltage supplied to an electronic circuit, including: a signal output circuit for outputting a signal voltage which exhibits a saturation characteristic with respect to an increase in the power supply voltage; and a signal voltage monitoring circuit for comparing the power supply voltage with the signal voltage, and outputting a signal indicating that the signal voltage is normal when there is a predetermined voltage difference between the power supply voltage and the signal voltage.

In the power supply voltage monitoring circuit according to the present invention: the signal output circuit which includes an impedance circuit supplied with current from a power source via a current supply circuit, generates the signal voltage through the impedance circuit, and outputs the signal voltage thus generated; and the signal voltage monitoring circuit compares the signal voltage output from the signal output circuit with the power supply voltage, and outputs a signal indicating that the power supply voltage has become equal to or larger than a minimum operating power supply voltage of the electronic circuit when there is the predetermined voltage difference between the power supply voltage and the signal voltage.

In the power supply voltage monitoring circuit according to the present invention, the signal output circuit generates the signal voltage through the impedance circuit, as a reference voltage to be compared with the power supply voltage and further as a voltage which exhibits temperature dependence, and outputs the signal voltage thus generated.

In the power supply voltage monitoring circuit according to the present invention: the signal output circuit outputs, when power is turned on, a signal voltage which increases along with an increase in the power supply voltage until the power supply voltage makes a transition to a predetermined voltage, and outputs a voltage which monotonously increases and has a saturation characteristic in a case where the power supply voltage continues to increase after exceeding the predetermined voltage and further increases; and the signal voltage monitoring circuit compares the signal voltage output from the signal output circuit with the power supply voltage, and outputs a signal indicating that the power supply voltage has exceeded than a minimum operating power supply voltage of the electronic circuit when there is the predetermined voltage difference between the power supply voltage and the signal voltage.

In the power supply voltage monitoring circuit according to the present invention, the signal voltage monitoring circuit includes a comparison circuit with an offset function which sets an offset potential as one of two signals input thereto, the offset potential being determined based on a potential difference determined in advance, and outputs a signal indicating that the power supply voltage has exceeded a minimum operating power supply voltage in a case where a potential difference between the two signals satisfies the offset potential.

In the power supply voltage monitoring circuit according to the present invention, the signal output circuit includes a current supply circuit and an impedance circuit, which are connected in series, and outputs the signal voltage from a circuit connection point between the current supply circuit and the impedance circuit.

In the power supply voltage monitoring circuit according to the present invention, the impedance circuit is a sensor for inputting a current output from the current supply circuit and outputting a voltage signal corresponding to detected physical quantities.

In the power supply voltage monitoring circuit according to the present invention, the sensor is a temperature sensor for detecting temperatures.

The present invention also provides an electronic circuit including any one of the power supply voltage monitoring circuits described above.

The power supply voltage monitoring circuit according to the present invention includes the signal output circuit and the signal voltage monitoring circuit. The signal output circuit outputs a signal voltage which exhibits a saturation characteristic with respect to a power supply voltage applied to a temperature sensor or the like. The signal voltage monitoring circuit compares the signal voltage output from the signal output circuit and the power supply voltage, and in a case where there is a predetermined voltage difference between the power supply voltage and the signal voltage, outputs a signal indicating that the signal voltage output from the signal output circuit is normal.

With this configuration, the minimum operating power supply voltage may be reduced in an electronic circuit, and the power supply voltage may be used with efficiency. As a result, for example, the minimum operating power supply voltage requirements in an integrated circuit (IC) may be reduced.

DETAILED DESCRIPTION OF THE PREFERRED EMBODIMENTS

In the following, embodiments of the present invention are described with reference to the accompanying drawings.
(First Embodiment)

Figure 1:
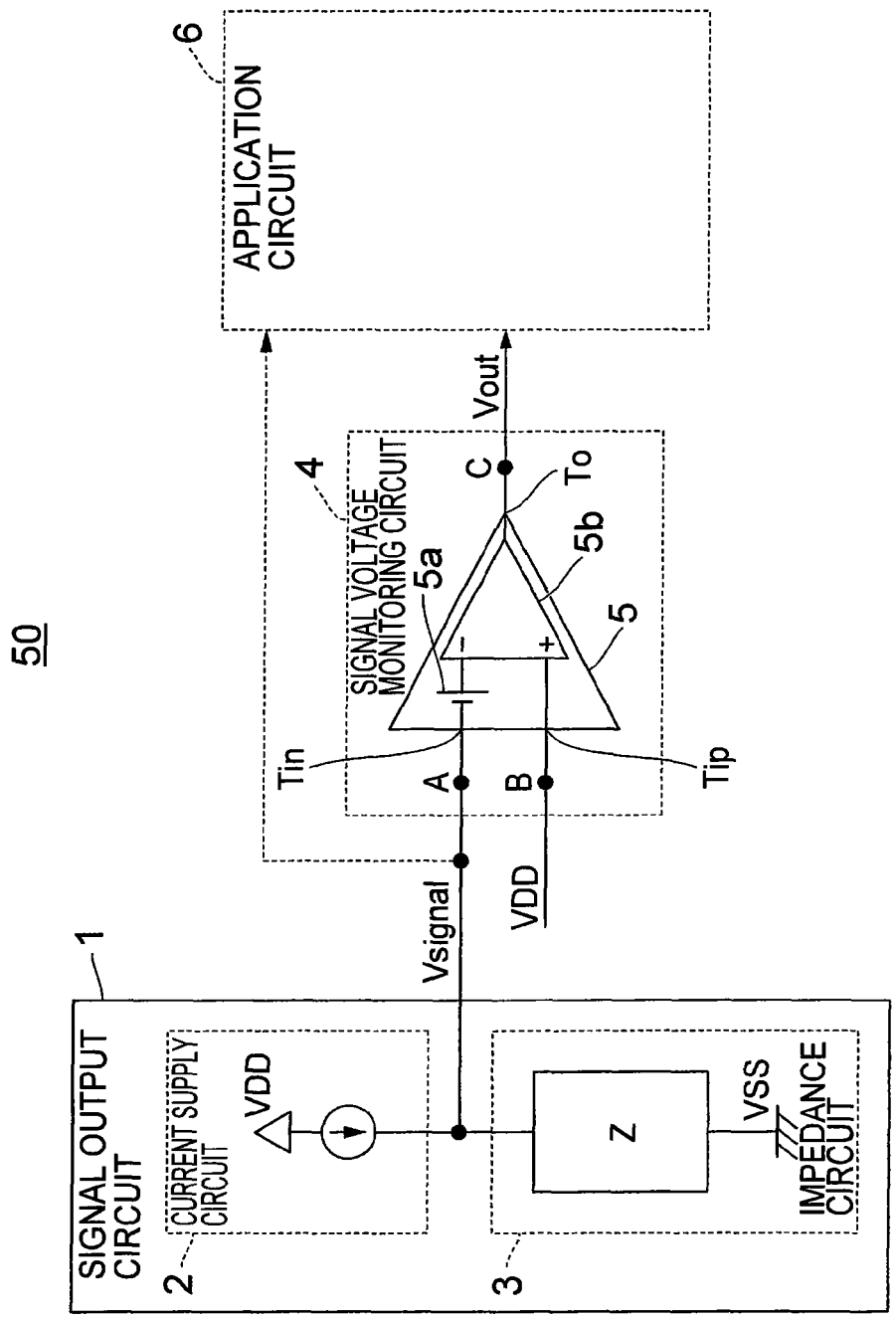
FIG. 1 is a schematic configuration diagram illustrating a power supply voltage monitoring circuit according to a first embodiment of the present invention.

FIG. 1 is a schematic configuration diagram illustrating a power supply voltage monitoring circuit 50 according to a first embodiment of the present invention.

The power supply voltage monitoring circuit 50 includes a signal output circuit 1 and a signal voltage monitoring circuit 4. An output signal from the power supply voltage monitoring circuit 50 is output to an application circuit 6 disposed at a subsequent stage. Further, an output signal from the signal output circuit 1 may also be used in the application circuit 6.

The signal output circuit 1 in the power supply voltage monitoring circuit 50 includes a current supply circuit 2 for supplying a constant current and an impedance circuit 3 for receiving, as an input, a current from the current supply circuit 2. The current supply circuit 2 and the impedance circuit 3 are connected in series. Further, a signal voltage Vsignal is output from a circuit connection point between the current supply circuit 2 and the impedance circuit 3.

The impedance circuit 3 includes a diode or the like which is biased in the forward direction and is used as a temperature sensor. The impedance circuit 3 exhibits a high-impedance state when power is turned on, that is, in a case where the power supply voltage VDD is small and the amount of current supplied to the impedance circuit 3 is small, until a power supply voltage VDD makes a transition to a predetermined voltage, and the signal voltage Vsignal is equal to the power supply voltage VDD. In other words, in a state where the power supply voltage VDD is low, the signal voltage Vsignal output from the impedance circuit 3 linearly increases along with the increase in the power supply voltage VDD (see the signal voltage Vsignal and the power supply voltage VDD of FIG. 4).

Then, in a case where the power supply voltage VDD has increased to exceed a predetermined voltage, the amount of current flowing into the impedance circuit 3 via the current supply circuit 2 increases. When the amount of current flowing into the impedance circuit 3 becomes equal to or larger than a predetermined value, the voltage between both the ends of the impedance circuit 3 exhibits a saturation characteristic and is maintained at a constant voltage (threshold voltage). When the power supply voltage VDD further increases and the amount of current supplied to the impedance circuit 3 further increases, the voltage between both the ends of the impedance circuit 3 gradually increases monotonously while exhibiting a saturation characteristic, from the above-mentioned constant value. It should be noted that in a case where the impedance circuit 3 includes a diode or the like for use as a temperature sensor, the above-mentioned constant voltage (threshold voltage) exhibits temperature dependence. The impedance circuit 3 is described later in detail.

The signal voltage Vsignal output from the impedance circuit 3 described above serves as a reference voltage when the signal voltage Vsignal is compared with the power supply voltage VDD in the signal voltage monitoring circuit 4. In a case where the impedance circuit 3 includes a diode or the like for use as a temperature sensor, the signal voltage Vsignal exhibits temperature dependence.

The signal voltage monitoring circuit 4 in the power supply voltage monitoring circuit 50 includes two input terminals Tip and Tin, and an output terminal To. The signal voltage monitoring circuit 4 compares potentials of two input signals, detects whether or not a potential difference therebetween is equal to or larger than a predetermined value, and outputs the detection result as a logic signal binarized into two levels, namely, a low level and a high level.

An offset comparator 5 is illustrated as an embodiment of the signal voltage monitoring circuit 4. The offset comparator 5 includes a bias voltage source 5a and a comparator 5b. The bias voltage source 5a generates a predetermined bias potential Vb, and sets a voltage offset to an input signal input to the input terminal Tip. The comparator 5b detects the potential difference between the two input signals.

In the offset comparator 5, the input terminal Tin is connected to an inverting input terminal of the comparator 5b via the bias voltage source 5a, the input terminal Tip is connected to a non-inverting input terminal of the comparator 5b, and an output terminal of the comparator 5b is connected to the output terminal To.

A signal input to the input terminal Tin is converted by the bias voltage source 5a so as to have a potential increased by the bias potential Vb, and input to the comparator 5b. With this configuration, the offset comparator 5 compares a voltage of a signal input to the input terminal Tip, with a threshold voltage which is obtained by increasing the voltage of a signal input to the input terminal Tin by a predetermined voltage (bias potential Vb).

When a transition from a low state to a high state is effected on a potential of a signal VDD input to the input terminal Tip as compared with a voltage obtained by adding the bias potential Vb to a potential of a signal Vsignal input to the input terminal Tin, an output signal Vout is inverted. The output signal Vout exhibits a low level in a state where the potential of the signal VDD input to the input terminal Tip is lower than the voltage obtained by adding the bias potential Vb to a potential of the input signal Vsignal input to the input terminal Tin. Alternatively, the output signal Vout exhibits a high level in a state where the potential of the signal VDD input to the input terminal Tip is larger than the voltage obtained by adding the bias potential Vb to a potential of the input signal Vsignal input to the input terminal Tin.

The output voltage Vout from the signal voltage monitoring circuit 4 is output to the application circuit 6 disposed at a subsequent stage. The application circuit 6 receives an input of the output voltage Vout from the signal voltage monitoring circuit 4, and detects that the output voltage Vout has made a transition to a high level, to thereby detect that the power supply voltage has exceeded the minimum operating power supply voltage. Further, the signal Vsignal output from the signal output circuit 1 may also be output to the application circuit 6, for example, as a signal from a temperature sensor, and may be used in the application circuit 6.

Figure 2A:
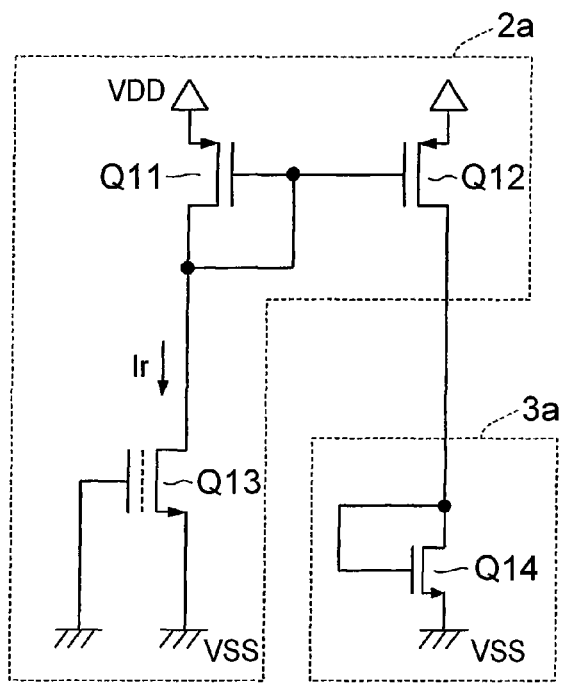
FIGS. 2A to 2E are diagrams for illustrating a configuration of a signal output circuit.

FIGS. 2A to 2E are diagrams for illustrating a configuration example of a signal output circuit. FIG. 2A illustrates an example where a current supply circuit 2a is formed of a depression-type positive channel metal oxide semiconductor (PMOS) transistor Q13 for generating a reference current Ir, and PMOS transistors Q11 and Q12 which form a current mirror circuit. Further, an impedance circuit 3a is formed of a negative channel metal oxide semiconductor (NMOS) transistor Q14 which has the gate and the drain thereof connected in common to a reference potential VSS, and the NMOS transistor Q14 is used as a diode (temperature detection sensor).

Figure 2B:
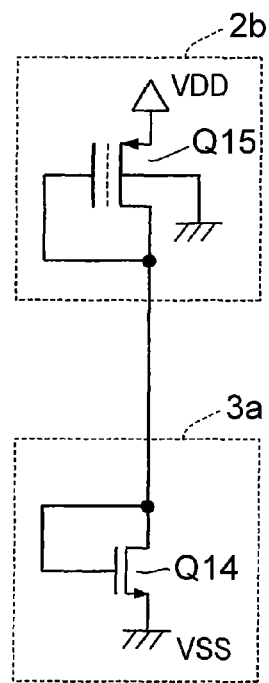
Figure 2C:
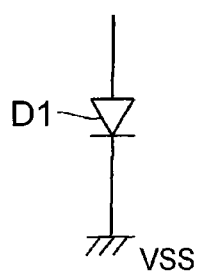
Figure 2D:
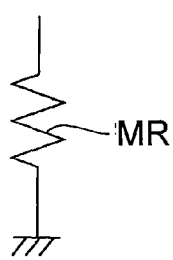
Figure 2E:
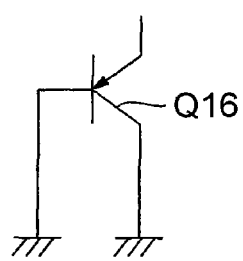

FIG. 2B illustrates an example where a current supply circuit 2b is formed of a back-biased depression-type PMOS transistor Q15, and the impedance circuit 3a is formed of, similarly to the impedance circuit 3a of FIG. 2A, the NMOS transistor Q14 which has the gate and the drain thereof connected in common to the reference potential VSS.

It should be noted that the impedance circuit 3a may not be limited to the NMOS transistor Q14 illustrated in FIGS. 2A and 2B, as long as the impedance circuit 3a is formed of a sensor which receives a current from the current supply circuit as an input and outputs a voltage signal corresponding to detected physical quantities. For example, a diode D for detecting temperatures illustrated in FIG. 2C may be used as the impedance circuit. Alternatively, a magnetoresistive element (MR element) illustrated in FIG. 2D may be used as the impedance circuit. Still alternatively, a bipolar transistor Q15 illustrated in FIG. 2E, which has the collector and the base thereof grounded in common, may be used as the temperature sensor.

Figure 3:
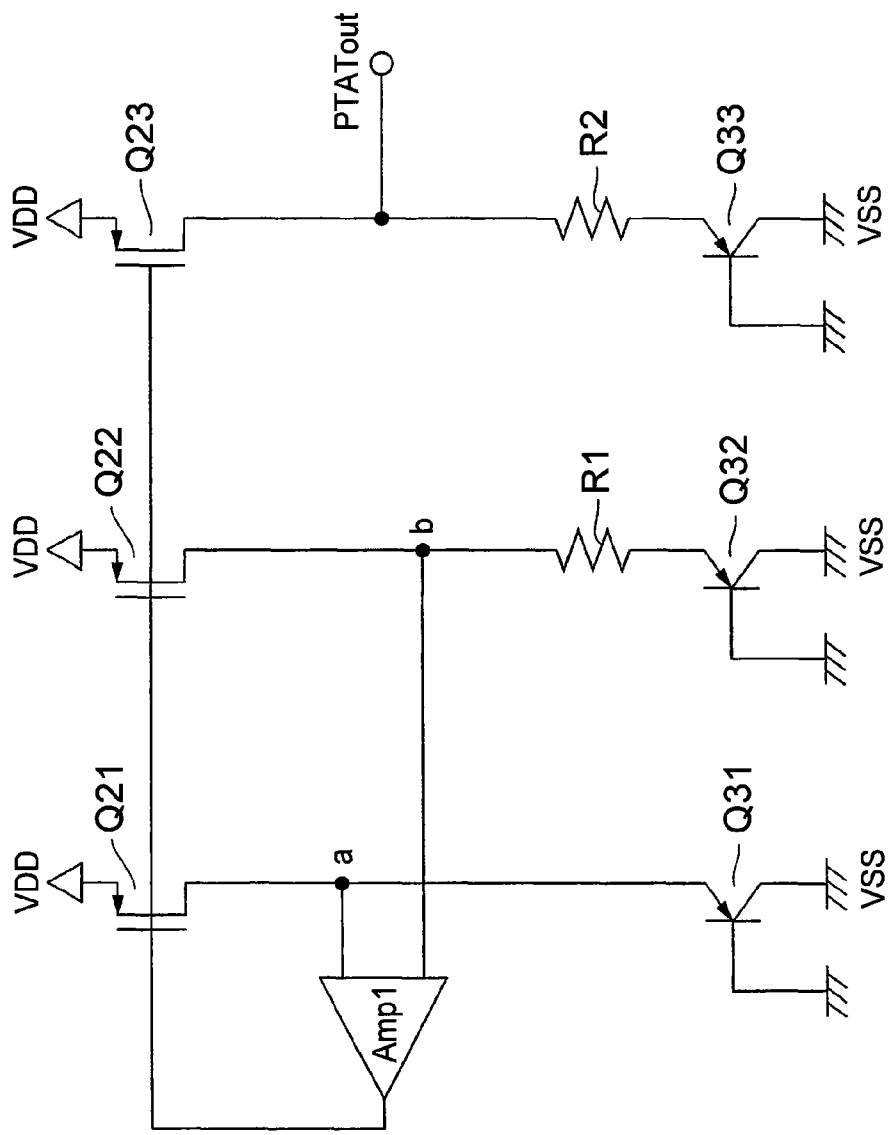
FIG. 3 illustrates an example of a bandgap reference circuit.

Further, the signal output circuit 1 may also be implemented as a bandgap reference circuit illustrated in FIG. 3. The bandgap reference circuit illustrated in FIG. 3 includes three PMOS transistors Q21, Q22, and Q23 which have the gates thereof connected in common.

Further, the bandgap reference circuit further includes a bipolar-type PNP transistor Q31 and a bipolar transistor Q32. The transistor Q31 has the emitter thereof connected to the drain of the PMOS transistor Q21, and the collector and the base thereof connected in common to the reference potential VSS. The transistor Q32 has the emitter thereof connected to the drain of the PMOS transistor Q22 via a resistor R1, and the collector and the base thereof connected in common to the reference potential VSS.

The bandgap reference circuit still further includes a bipolar-type PNP transistor Q33 which has the emitter thereof connected to the drain of the PMOS transistor Q23 via a resistor R2, and the collector and the base thereof connected in common to the reference potential VSS. Here, there is a relation of 1 to n (n≥1) between the emitter areas of the transistors Q31 and Q32.

Further, the emitter side (circuit point a) of the transistor Q31 and a circuit point b of the resistor R1 are input to input terminals of an operational amplifier Amp1 as imaginal short points, and an output terminal of the operational amplifier Amp1 is connected to the gates of the PMOS transistors Q21, Q22, and Q23. With this configuration, a current flowing through the PMOS transistors Q21 and Q22 is controlled such that the circuit point a and the circuit point b are at the same potential. Further, the resistors R1 and R2 may employ resistors with the same temperature coefficient, so that the resistors R1 and R2 have the same resistance value, for example.

With this configuration, a proportional to absolute temperature (PTAT) circuit is formed in which the PMOS transistor Q23 serves as the current supply circuit, and the resistor R2 and the transistor Q33 serve as the impedance circuit. An output voltage PTATout (voltage at the drain of the PMOS transistor Q23) is expressed as "PTATout=(Vt/R1)In(N)", where "Vt=KT/q, K: Boltzmann constant, T: absolute temperature, and q: charge amount of electrons", and the output voltage PTATout is output as a voltage proportional to the absolute temperature T.

As described above, the bandgap reference circuit illustrated in FIG. 3 includes the current supply circuit (PMOS transistor Q23) and the impedance circuit (resistor R2 and bipolar transistor Q33), and hence the bandgap reference circuit may be used as the signal output circuit 1 illustrated in FIG. 1. Further, for example, the bandgap reference circuit disclosed in JP 2001-147725 A may also be used as the signal output circuit 1 illustrated in FIG. 1, similarly to the above.

As described above, the signal output circuit 1 is formed of the current supply circuit and the impedance circuit. The impedance circuit herein may include any impedance circuit as long as the impedance circuit outputs a voltage, as a signal voltage, which linearly increases along with the increase in the power supply voltage VDD when power is turned on until the power supply voltage VDD makes a transition to a predetermined voltage, and when the power supply voltage has exceeded a predetermined voltage range, outputs a voltage at a constant value or a voltage which gradually increases monotonously from the constant value. In other words, the impedance circuit may not be limited to the transistor, the diode, the MR sensor, and the like illustrated in FIGS. 2A to 2E, and the bandgap reference circuit illustrated in FIG. 3, and may also include, for example, a zener diode (zener diode connected to a power source via a resistor).

Figure 4:
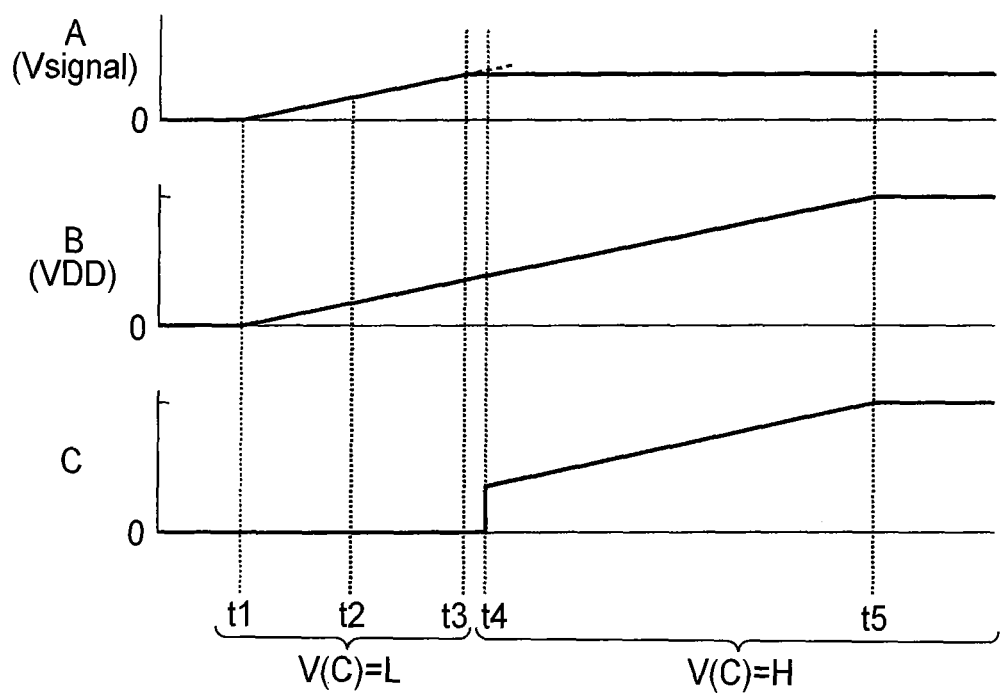
FIG. 4 is a timing chart for illustrating an operation of the power supply voltage monitoring circuit according to the first embodiment.

FIG. 4 is a timing chart for illustrating an operation of the power supply voltage monitoring circuit according to the first embodiment. The timing chart of FIG. 4 illustrates state transitions of the signal voltage Vsignal input to a point A of the signal voltage monitoring circuit 4 illustrated in FIG. 1, the power supply voltage VDD input to a point B of the same, and the output signal Vout output from a point C of the same.

In an initial state illustrated in FIG. 4, the power has not been turned on and no electric charge is accumulated in each of the circuits, and hence the signals each exhibit a non-signal state.

At a time t1, the signal output circuit 1 and the signal voltage monitoring circuit 4 are turned on. After that, the power supply voltage VDD gradually increases. The signal voltage Vsignal output from the signal output circuit 1 which is supplied with power from the same power source as the signal voltage monitoring circuit 4, is equal in voltage to the power supply voltage VDD due to the operation of the current supply circuit 2, in a state where the power supply voltage VDD is low. In other words, the signal voltage Vsignal gradually increases along with the increase in the power supply voltage VDD, exhibiting change characteristics similar to that of the power supply voltage VDD.

The signal voltage monitoring circuit 4 makes a judgment on input signals by comparing one of the signals with another, the one of the signals being applied with an offset potential. Accordingly, even when the potential difference between the input signals is small, the result of the judgment is output based on the comparison made between the potentials thus offset, without leading to an unsteady state where a signal of high level and a signal of low level are alternately output in a flip-flop manner. As a result, the signal Vout exhibits a low level. In other words, from the time t1 to a time t2, the signal voltage Vsignal and the power supply voltage VDD gradually increase in a linear manner, while the output signal Vout exhibits a low level because the potential difference between the signal voltage Vsignal and the power supply voltage VDD is smaller than an offset potential assigned to the offset comparator 5.

In a transitional state after power is turned on until a minimum operating power supply voltage is supplied, the signal Vout output from the signal voltage monitoring circuit 4 is retained at a low level. Based on the signal Vout thus retained at a low level, the application circuit 6 may be configured, for example, such that the application circuit 6 may place itself in an inactive state so as not to output an unnecessary signal when the signal Vout is at a low level.

At a time t2, the power supply voltage VDD increases, and the circuits each make a transition to an operation-enabled state. In the signal voltage monitoring circuit 4, despite the small potential difference between the signal voltage Vsignal and the power supply voltage VDD input thereto, the signal Vout is settled to a low level because one of the input signals has an offset voltage applied thereto. Based on the signal Vout thus settled to a low level, the application circuit 6 may be configured, for example, such that the application circuit 6 may place itself in an inactive state so as not to output an unnecessary signal.

At a time t3, the signal voltage Vsignal designated by a signal V(A), which is output from the signal output circuit 1, reaches a predetermined voltage and is output at a constant voltage due to the saturation voltage characteristic of the impedance circuit 3. The power supply voltage VDD output by the power source continues to increase in potential. Further, the potential difference between the signal voltage Vsignal and the power supply voltage VDD is smaller than the offset potential assigned to the offset comparator 5, and hence the signal Vout is retained at a low level.

At a time t4, the signal voltage monitoring circuit 4 detects that a potential difference generated between the signal voltage Vsignal output from the signal output circuit 1 and the power supply voltage VDD becomes equal to or larger than a predetermined voltage, namely, a voltage of the offset potential in the signal voltage monitoring circuit 4. The result of the detection indicates that, for example, the power supply voltage VDD applied by the power source has made a transition to a state where the power supply voltage VDD may be supplied as an operation-enabled power supply voltage to the signal output circuit 1 and the application circuit 6.

Accordingly, the signal voltage monitoring circuit 4 releases the low level state of the output signal output as the signal Vout, to thereby effect a transition to a high level. The potential of the signal Vout at the high level increases along with the potential increase in the power supply voltage VDD.

At a time t5, the power supply voltage VDD has increased to a predetermined operation-enabled power supply voltage and stops to increase further, and hence the power supply voltage VDD starts to exhibit a constant value. Further, the signal Vout stops to increase, and makes a transition to a state where the signal Vout exhibits a constant value.

As described above, each of the signals makes a state transition when power is turned on. The output signal Vout is retained at a low level until the power supply voltage VDD output by the power source increases to a predetermined operation-enabled power supply voltage, with the result that a signal which exhibits an unnecessary detection state may not be output as the output signal Vout.

Figure 5:
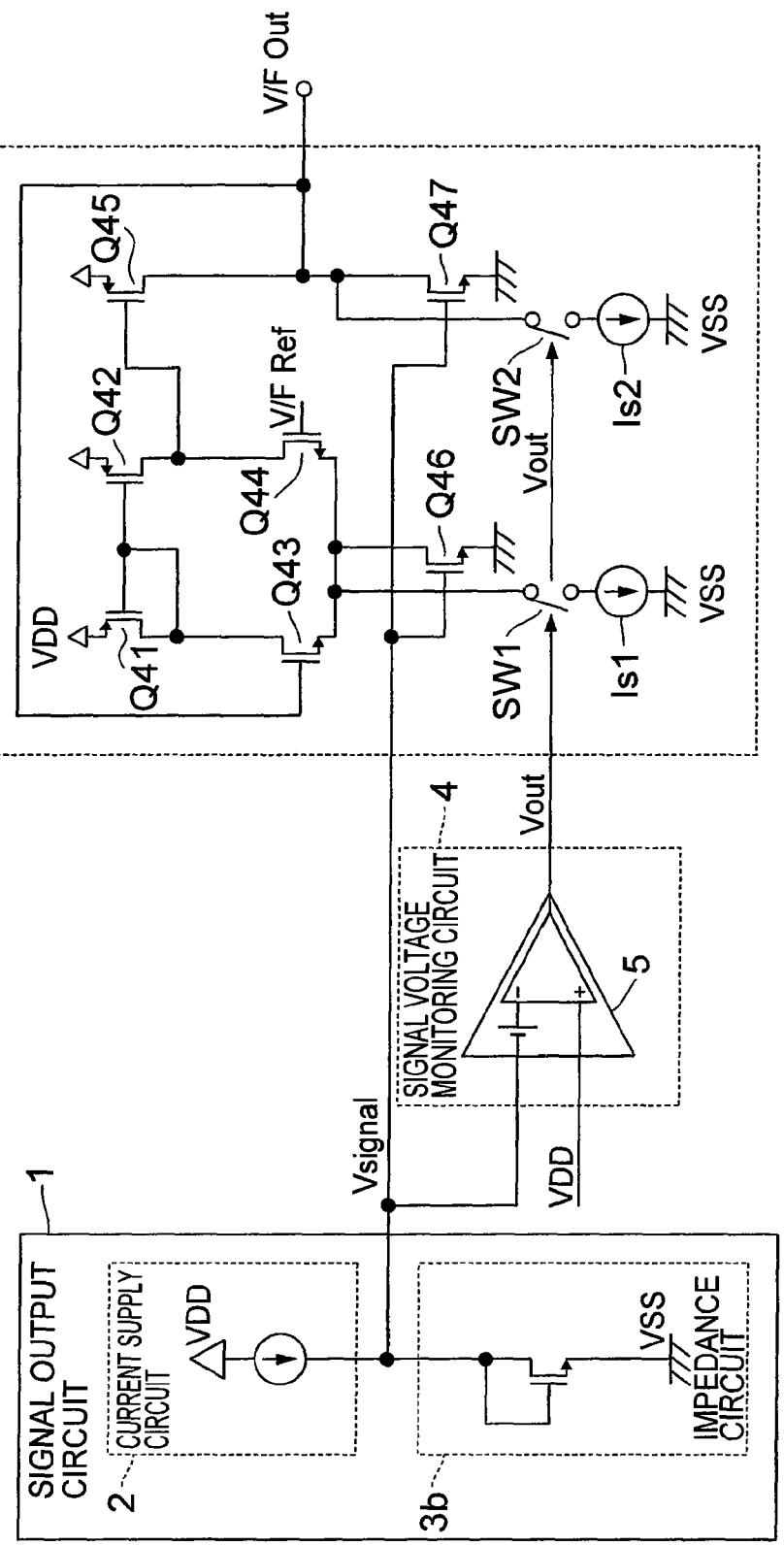
FIG. 5 illustrates a first example of an application circuit.

Further, FIG. 5 illustrates a first example of the application circuit 6 illustrated in FIG. 1, which includes a voltage follower circuit 6a as an example of an application circuit connected at a subsequent stage.

In the example illustrated in FIG. 5, the impedance circuit 3 in the signal output circuit 1 is formed as a temperature sensor in which the NMOS transistor is used as a diode, to thereby form the impedance circuit 3b. Further, in the example, the voltage follower circuit 6a uses both the signal voltage Vsignal output from the signal output circuit 1 and the output signal Vout from the signal voltage monitoring circuit 4.

The voltage follower circuit 6a includes a voltage follower circuit which is formed of a current mirror loaded-type actuation input stage and a current loaded-type source grounded gain stage, in which a voltage of an input signal V/F Ref input to the gate of the NMOS transistor Q44 is output as a voltage of an output signal V/F Out.

In the voltage follower circuit 6a, the current mirror loaded-type actuation input stage includes a current mirror circuit formed of PMOS transistors Q41 and Q42, NMOS transistors Q43 and Q44 which receive an actuation signal input to the gates thereof, and NMOS transistors Q46 and Q47 which serve as a bias current source. Further, the NMOS transistor Q43 has the gate thereof connected to the drain of a PMOS transistor Q45, to thereby form the voltage follower circuit. The PMOS transistor Q45 and the NMOS transistor Q47 form the current loaded-type source grounded gain stage.

In the configuration described above, the signal voltage Vsignal output from the signal output circuit 1 is input to the gates of the NMOS transistors Q46 and Q47. In other words, the NMOS transistors Q46 and Q47, which receive the signal voltage Vsignal input to the gates thereof, generate a bias current in the voltage follower circuit 6a.

With this configuration, the power supply voltage VDD increases, and when the voltage level of the signal voltage Vsignal output from the signal output circuit 1 exceeds a threshold value of the gate-drain voltage of each of the NMOS transistors Q46 and Q47, the NMOS transistors Q46 and Q47 generate a bias current in the voltage follower circuit 6a, to thereby start the operation as the voltage follower circuit 6a. In this manner, the voltage follower circuit 6a may be directly activated by the signal voltage Vsignal from the signal output circuit 1, with the result that the minimum operating power supply voltage may be reduced in the voltage follower circuit 6a.

Further, in the voltage follower circuit 6a illustrated in FIG. 5, the signal voltage Vsignal decreases along with a decrease in the power supply voltage VDD, which leads to a decrease in the bias current, with the result that the operating point of the voltage follower circuit 6a may be significantly deviated from the assumption. In this case, switches SW1 and SW2 may be on-off controlled by the signal Vout so that the decrease in the bias current may be supplemented by current sources Is1 and Is2. It should be noted that the signal Vout is an output signal from the offset comparator 5 in the signal voltage monitoring circuit 4.

Figure 6:
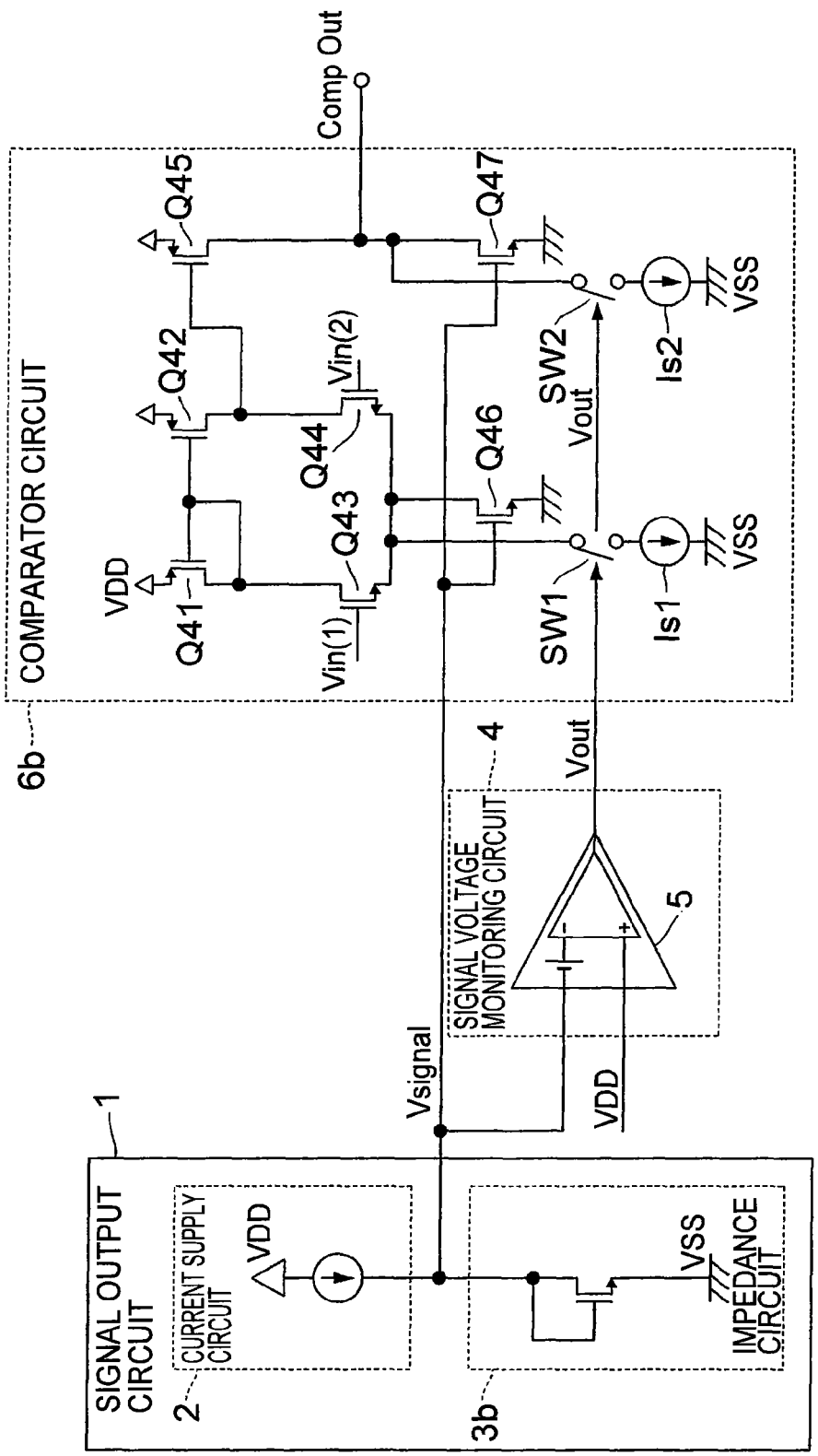
FIG. 6 illustrates a second example of the application circuit.

Further, FIG. 6 illustrates a second example of the application circuit 6 illustrated in FIG. 1, which includes a comparator circuit 6b as an example of an application circuit connected at a subsequent stage.

In the example illustrated in FIG. 6, the impedance circuit 3 in the signal output circuit 1 is formed as a temperature sensor in which the NMOS transistor is used as a diode, to thereby form the impedance circuit 3b. Further, in the example, the comparator circuit 6b uses both the signal voltage Vsignal output from the signal output circuit 1 and the output signal Vout from the signal voltage monitoring circuit 4.

The comparator circuit 6b is similar in circuit configuration to the voltage follower circuit 6a illustrated in FIG. 5, in which the same component parts are denoted by the same reference symbols, and the redundant description thereof is omitted. In the comparator circuit 6b, voltages of a signal Vin(1) and a signal Vin(2) input to the gates of the NMOS transistors Q43 and Q44, respectively, are compared with each other, and the result of the comparison is output as an output signal Comp Out.

With this configuration, the power supply voltage VDD increases, and when the voltage level of the signal voltage Vsignal output from the signal output circuit 1 exceeds a threshold value of the gate-drain voltage of each of the NMOS transistors Q46 and Q47, the NMOS transistors Q46 and Q47 generate a bias current in the comparator circuit 6b, to thereby start the operation as the comparator circuit 6b. In this manner, the comparator circuit 6b may be directly activated by the signal voltage Vsignal output from the signal output circuit 1, with the result that the minimum operating power supply voltage may be reduced in the comparator circuit 6b.

Further, in the comparator circuit 6b illustrated in FIG. 6, the signal voltage Vsignal decreases along with a decrease in the power supply voltage VDD, which leads to a decrease in the bias current, with the result that the operating point of the comparator circuit 6b may be significantly deviated from the assumption. In this case, switches SW1 and SW2 may be on-off controlled by the signal Vout so that the decrease in the bias current may be supplemented by current sources Is1 and Is2. It should be noted that the signal Vout is an output signal from the offset comparator 5 in the signal voltage monitoring circuit 4.

In the above, the first embodiment of the present invention is described. In the power supply voltage monitoring circuit 50 illustrated in FIG. 1, the signal output circuit 1 corresponds to the signal output circuit described above, the signal voltage monitoring circuit 4 corresponds to the signal voltage monitoring circuit described above. Further, the offset comparator 5 corresponds to the comparison circuit with an offset function described above, the current supply circuit 2 corresponds to the current supply circuit described above, and the impedance circuit 3 corresponds to the impedance circuit.

Then, the power supply voltage monitoring circuit 50 illustrated in FIG. 1 includes the signal output circuit 1 and the signal voltage monitoring circuit 4. The signal output circuit 1 outputs a signal voltage Vsignal which exhibits a saturation characteristic with respect to a voltage applied to a temperature sensor or the like, and the signal voltage monitoring circuit 4 compares the signal voltage Vsignal with the power supply voltage VDD, and in a case where there is a predetermined voltage difference between the power supply voltage VDD and the signal voltage Vsignal, outputs a signal Vout indicating that the signal voltage Vsignal is normal. With this configuration, the minimum operating power supply voltage in the electric circuit may be reduced, to thereby use the power supply voltage with efficiency. Further, even if the power supply voltage VDD is considerably lower than a rated operating voltage, the operation of the circuit may be enabled with the power supply voltage VDD without the need to wait until the power supply voltage VDD increases to a predetermined voltage.

Further, the power supply voltage monitoring circuit 50 of the present invention includes the impedance circuit 3, the signal output circuit 1, and the signal voltage monitoring circuit 4. The impedance circuit 3 is supplied with a current from the power source via the current supply circuit 2. The signal output circuit 1 generates the signal voltage Vsignal through the impedance circuit 3 and outputs the signal voltage Vsignal. The signal voltage monitoring circuit 4 compares the signal voltage Vsignal output from the signal output circuit 1 with the power supply voltage VDD, and when there is a predetermined potential difference between the power supply voltage VDD and the signal voltage Vsignal, outputs the signal Vout indicating that the power supply voltage VDD has become equal to or larger than the minimum operating power supply voltage of the electronic circuit. With this configuration, the minimum operating power supply voltage in the electric circuit may be reduced, to thereby use the power supply voltage with efficiency.

Further, in the power supply voltage monitoring circuit 50 of the present invention, the impedance circuit 3 generates and outputs the signal voltage Vsignal as a reference voltage to be compared with the power supply voltage VDD, and further as a voltage which exhibits temperature dependence. In this manner, a detection signal from a temperature sensor such as a diode for detecting temperatures may be set as the signal voltage Vsignal, and the signal voltage Vsignal may be compared with the power supply voltage VDD, to thereby output the signal Vout which indicates that the signal voltage Vsignal is normal.

Further, in the power supply voltage monitoring circuit 50 of the present invention, the signal output circuit 1 outputs, as the signal voltage Vsignal, a voltage which increases along with the increase in the power supply voltage VDD when power is turned on until the power supply voltage VDD reaches a predetermined voltage, and in a case where the power supply voltage VDD further increases to exceed the predetermined voltage, the signal output circuit 1 outputs, as the signal voltage Vsignal, a voltage which monotonously increases while exhibiting a saturation characteristic. The signal voltage monitoring circuit 4 compares the signal voltage Vsignal output from the signal output circuit 1 with the power supply voltage VDD, and when there is a predetermined potential difference between the power supply voltage VDD and the signal voltage Vsignal, outputs the signal Vout indicating that the power supply voltage VDD has become equal to or larger than the minimum operating power supply voltage of the electronic circuit. With this configuration, the minimum operating power supply voltage in the electric circuit may be reduced, to thereby use the power supply voltage with efficiency.

Further, in the power supply voltage monitoring circuit 50 of the present invention, the signal voltage monitoring circuit 4 includes a comparator (offset comparator 5) in which an offset potential is set to one of the input terminals thereof. The comparator (offset comparator 5) is used to compare the signal voltage Vsignal output from the signal output circuit 1 with the power supply voltage VDD, and in a case where a potential difference between the signal voltage Vsignal output from the signal output circuit 1 and the power supply voltage VDD satisfies the offset potential, the signal Vout which indicates that the power supply voltage VDD has exceeded the minimum operating power supply voltage is output. With this configuration, the minimum operating power supply voltage in the electric circuit may be detected with ease based on the signal from the signal output circuit and the offset potential.

Further, in the power supply voltage monitoring circuit 50 of the present invention, the signal output circuit 1 is formed of the current supply circuit 2 and the impedance circuit 3 which are connected in series, and a signal voltage is output from a circuit connection point between the current supply circuit 2 and the impedance circuit 3. With this configuration, the signal output circuit 1 may be configured with ease by employing, as the impedance circuit, for example, a diode or the like which is biased in the forward direction. Further, the impedance circuit may be formed of a temperature sensor or the like.

Further, in the power supply voltage monitoring circuit 50 of the present invention, the impedance circuit 3 includes a sensor which receives an input of a current output from the current supply circuit 2 and outputs a voltage signal corresponding to the detected physical quantities. With this configuration, the output signal from the sensor may be detected as a detection target, to thereby easily detect the level of the power supply voltage at which the sensor is capable of operating in a stable manner. Accordingly, the power supply voltage at which the sensor is capable of operating in a stable manner may be set as the minimum operating power supply voltage of the electronic circuit, to thereby reduce the minimum operating power supply voltage of the electronic circuit, with the result that the power supply voltage may be used with efficiency.

Further, in the power supply voltage monitoring circuit 50 of the present invention, the impedance circuit 3 includes a temperature sensor which receives an input of a current output from the current supply circuit 2 and outputs a voltage signal corresponding to the detected temperature. With this configuration, the output signal from the temperature sensor may be detected as a detection target, to thereby easily detect the level of the power supply voltage at which the temperature sensor is capable of operating in a stable manner. Accordingly, the power supply voltage at which the temperature sensor is capable of operating in a stable manner may be set as the minimum operating power supply voltage of the electronic circuit, to thereby reduce the minimum operating power supply voltage of the electronic circuit, with the result that the power supply voltage may be used with efficiency.

Further, the electronic circuit of the present invention includes the power supply voltage monitoring circuit 50 of the present invention, to thereby reduce the minimum operating power supply voltage of the electronic circuit, with the result that the power supply voltage may be used with efficiency.

(Second Embodiment)

Figure 7:
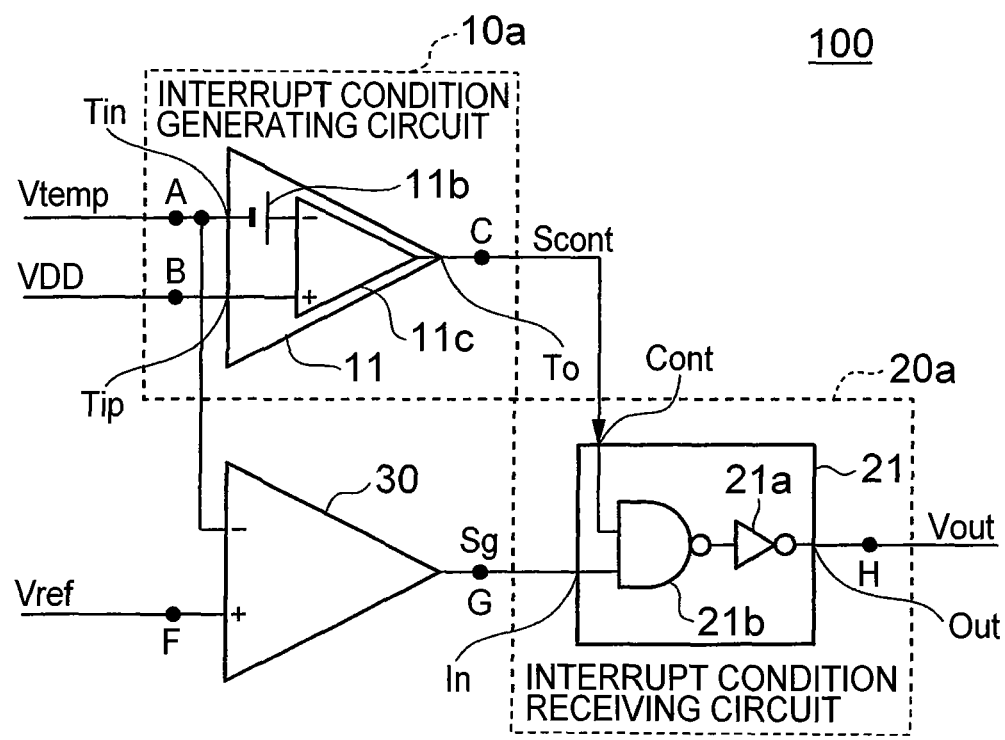
FIG. 7 is a schematic configuration diagram illustrating a detection circuit according to a second embodiment of the present invention.

FIG. 7 is a schematic configuration diagram illustrating a detection circuit according to a second embodiment of the present invention. The second embodiment is an application of the power supply voltage monitoring circuit according to the first embodiment illustrated in FIG. 1, and illustrated as an example of a detection circuit for detecting a signal from a temperature sensor or the like.

In the second embodiment illustrated in FIG. 7, the impedance circuit in the signal output circuit 1 illustrated in FIG. 1 is configured, for example, as a temperature sensor such as a diode as illustrated in FIGS. 2A to 2E, and the temperature sensor outputs a signal Vtemp. That is, the signal voltage Vsignal output from the signal output circuit 1 illustrated in FIG. 1 is replaced by the output signal Vtemp from the temperature sensor. Further, the second embodiment is illustrated as an example where the signal voltage monitoring circuit 4 illustrated in FIG. 1 is used as an interrupt condition generating circuit 10a illustrated in FIG. 7.

It should be noted that the detection circuit described later with reference to the third to eighth embodiments and a sensor device described in the ninth embodiment are also illustrated as an application of the power supply voltage monitoring circuit according to the first embodiment of the present invention illustrated in FIG. 1. Further, the offset comparator 5 forming the signal voltage monitoring circuit 4 of FIG. 1 corresponds to an offset comparator 11 in the interrupt condition generating circuit according to the fourth to seventh embodiment.

A detection circuit 100 illustrated in FIG. 7 includes an interrupt condition generating circuit 10a, an interrupt condition reception circuit 20a, and a comparator 30. The interrupt condition generating circuit 10a in the detection circuit 100 includes two input terminals Tip and Tin and an output terminal To. The interrupt condition generating circuit 10a compares potentials of two input signals, detects whether or not a potential difference therebetween is equal to or larger than a predetermined value, and outputs the detection result as a binarized logic signal.

An offset comparator 11 is illustrated as an embodiment of the interrupt condition generating circuit 10a. The offset comparator 11 includes a bias voltage source 11b and a comparator 11c. The bias voltage source 11b generates a predetermined bias potential Vb, and sets a voltage offset, which corresponds to the amount of the generated bias potential Vb, to an input signal. The comparator 11c detects the potential difference between the two input signals.

In the offset comparator 11, the input terminal Tin is connected to an inverting input terminal of the comparator 11c via the bias voltage source 11b, the input terminal Tip is connected to a non-inverting input terminal of the comparator 11c, and an output terminal of the comparator 11c is connected to the output terminal To.

A signal input to the input terminal Tin is converted by the bias voltage source 11b so as to have a potential increased by the bias potential Vb, and input to the comparator 11c.

With this configuration, the offset comparator 11 compares a voltage of a signal input to the input terminal Tip, with a threshold voltage which is obtained by increasing the voltage of a signal input to the input terminal Tin by a predetermined voltage (bias potential Vb). When a transition from a low state to a high state is effected on a potential of the signal input to the input terminal Tip as compared with a voltage obtained by adding the bias potential Vb to a potential of the signal input to the input terminal Tin, an output signal is inverted. The output signal exhibits a low level in the former state (state where the potential is lower than the voltage obtained by adding the bias potential Vb to the potential of the input signal to the input terminal Tin). The interrupt condition generating circuit 10a outputs a signal which is the same as the signal output from the offset comparator 11.

The interrupt condition reception circuit 20a includes a signal input terminal In, a control input terminal Cont, and an output terminal Out. An output setting circuit 21 is illustrated as an embodiment of the interrupt condition reception circuit 20a. The output setting circuit 21 includes an inverter (inverting circuit) 21a and a NAND (inverted AND) gate 21b. The output setting circuit 21 has the signal input terminal In connected to one of input terminals of the NAND gate 21b, the control input terminal Cont connected to the other one of the input terminals of the NAND gate 21b, and the output terminal of the NAND gate 21b connected to the output terminal Out via the inverter 21a. With this configuration, in a case where a control signal Scont input to the control input terminal Cont is at a low level, an output signal Vout is set at a low level, whereas in a case where the control signal Scont is at a high level, a signal exhibiting the same logic as that of an input signal Sg is output as the output signal Vout. In other words, the interrupt condition reception circuit 20a outputs, as the output signal Vout, a predetermined voltage exhibiting a low level, without allowing the input signal Sg to be output, until the interrupt caused by the interrupt signal input as the control signal is released. Alternatively, when the interrupt caused by the interrupt signal is released, the interrupt condition reception circuit 20a allows the input signal Sg to be output, and outputs the input signal Sg as the output signal Vout.

The comparator 30 detects a potential difference between two input signals, and outputs a result of judgment made based on the detected potential difference, as a binarized logic signal.

Next, a connection example of the detection circuit 100 forming the sensor circuit is described. The detection circuit 100 receives an input of a power supply voltage VDD for actuating the detection circuit 100, an input signal Vtemp from the sensor circuit (not shown), and an input of a reference voltage Vref output from a reference power source RF (not shown). The sensor circuit (not shown) and the reference power source RF (not shown) each have a constant current source connected to a power supply terminal connected to a power source, and are each connected to a ground voltage VSS via an impedance element which serves as a load in the constant current source. The sensor circuit and the reference power source RF each have an output voltage output from a connection point between the constant current source and the impedance element. Accordingly, in a state where the power supply voltage VDD is low, the output voltages are equal to the power supply voltage due to the operation of the current source.

The interrupt condition generating circuit 10a has the input terminal Tip connected to a power source from which the power supply voltage VDD is input, and the input terminal Tin connected to an output terminal of the sensor circuit (not shown).

The comparator 30 has a non-inverting input terminal connected to the reference power source RF (not shown) which outputs the reference voltage Vref, and an inverting input terminal connected to the output terminal of the sensor circuit (not shown).

The interrupt condition reception circuit 20a has the input terminal In connected to an output terminal of the comparator 30, the control input terminal Cont connected to the output terminal To of the interrupt condition generating circuit 10a, and the output terminal Out connected to an output terminal of the detection circuit 100.

In the detection circuit 100 configured as described above, the control signal Scont output from the interrupt condition generating circuit 10a exhibits a low level in a case where the power supply voltage VDD is lower than a potential obtained by adding the bias potential Vb to the voltage of the input signal Vtemp. Meanwhile, the control signal Scont output from the interrupt condition generating circuit 10a exhibits a high level in a case where the power supply voltage VDD is higher than a potential obtained by adding the bias potential Vb to the voltage of the input signal Vtemp.

The output signal Sg of the comparator 30 exhibits a high level in a case where the voltage of the input signal Vtemp is lower than the reference voltage Vref. Meanwhile, the output signal Sg exhibits a low level in a case where the voltage of the input signal Vtemp is higher than the reference voltage Vref.

In the case where the control signal Scont exhibits a low level, the interrupt condition reception circuit 20a fixedly outputs the output signal Vout at a low level, whereas in the case where the control signal Scont exhibits a high level, the interrupt condition reception circuit 20a outputs the output signal Sg from the comparator 30 as the output signal Vout, the output signal Sg being changed according to the input signal Vtemp.

Figure 8:
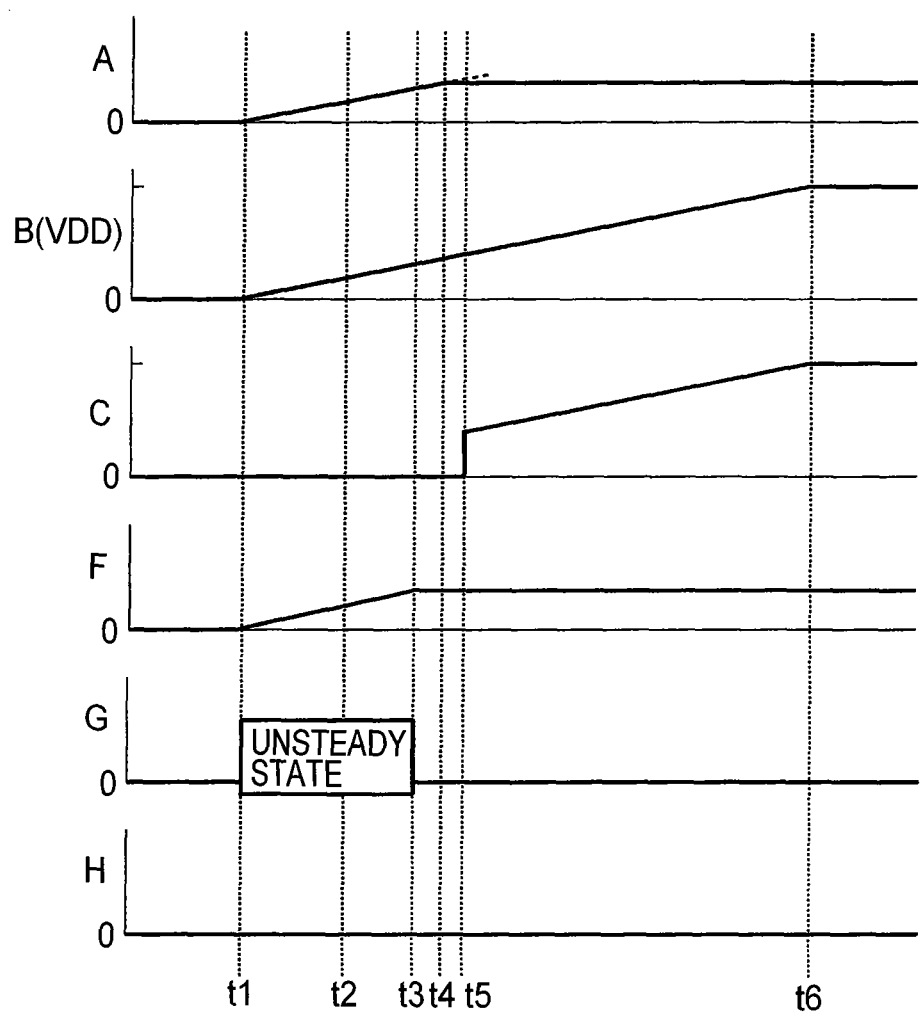
FIG. 8 is a timing chart for illustrating an operation of the detection circuit according to the second embodiment.

FIG. 8 is an example of a timing chart for illustrating an operation of the detection circuit 100 according to the second embodiment. With reference to points A, B, C, F, G, and H illustrated in the block diagram of FIG. 7, a signal transition at each of those points is described.

A waveform at the point A shows a voltage transition of the input signal Vtemp which is input from the sensor circuit and is subjected to the detection processing in the detection circuit 100. A waveform at the point B shows a voltage transition of the power supply voltage VDD supplied to the detection circuit 100. The power supply voltage VDD corresponds to the power supply voltage supplied to the detection circuit 100, the reference power source RF (not shown in FIG. 7), and the sensor circuit (not shown in FIG. 7). A waveform at the point C shows a voltage transition of the control signal Scont which has been subjected to the judgment made by the offset comparator 11 in the interrupt condition generating circuit 10a and output from the interrupt condition generating circuit 10a. The interrupt condition reception circuit 20a is controlled based on the control signal Scont. A waveform at the point F shows a voltage transition of the reference voltage Vref output from the reference power source RF. A waveform at the point G shows a voltage transition of the output signal Sg output as a result of the judgment made by the comparator 30. The output signal Sg corresponds to an input signal to the interrupt condition reception circuit 20a. A waveform at the point H shows a voltage transition of the output signal Vout output from the interrupt condition reception circuit 20a. In the range illustrated in the timing chart, there is occurring no event to be detected by the sensor circuit, and hence the output signal Vout constantly exhibits a low level.

In the initial state illustrated in FIG. 8, the power has not been turned on and no electric charge is accumulated in each of the circuits, and hence the signals each exhibit a non-signal state.

At a time t1, the detection circuit 100, and the sensor circuit and the reference power source RF, which are connected to the detection circuit 100, are turned on.

After that, the power supply voltage VDD gradually increases. The input signal Vtemp and the reference voltage Vref output respectively from the sensor circuit and the reference power source RF, which are supplied with power from the same power source, are equal in voltage to the power supply voltage VDD due to the operation of the current source, in a state where the power supply voltage VDD is low. The input signal Vtemp and the reference voltage Vref also gradually increase, along with the increase in power supply voltage VDD, exhibiting change characteristics similar to the power supply voltage VDD.

The interrupt condition generating circuit 10a makes a judgment on input signals by comparing one of the signals with another, the one of the signals being applied with an offset potential. Accordingly, even when the potential difference between the input signals is small, a result of the judgment is output based on the comparison using the potential thus offset, without leading to an unsteady state where a signal of high level and a signal of low level are alternately output in a flip-flop manner. As a result, the control signal Scont exhibits a low level.

In the detection circuit 100, an unnecessary detection signal may be output as the output signal Sg from the comparator 30 in a transitional state after power-on until the operation-enabled power supply voltage is supplied. In other words, the power supply voltage VDD is insufficient for proper operation of an input signal judgment circuit provided to the comparator 30, and hence the state of the output signal Sg becomes unsteady and may not be identified.

On the other hand, the interrupt condition reception circuit 20a outputs a predetermined voltage as the output signal Vout without allowing the input signal to be output, until the power supply voltage reaches the predetermined voltage. The predetermined voltage output as the output signal Vout is defined as a voltage which exhibits a non-detection state (released state) in the sensor circuit, and is controlled according to the control signal Scont. The control signal Scont is output at a low level, and hence the output signal Vout is securely retained at a low level, with the result that a signal which exhibits an unnecessary detection state is not output.

At a time t2, the power supply voltage VDD increases, and the circuits each make a transition to an operation-enabled state.

In the interrupt condition generating circuit 10a, the input signal Vtemp increases along with the increase in power supply voltage VDD, and hence the potential difference therebetween is small. One of the signals has an offset voltage applied thereto, and hence the control signal Scont to be output is settled to a low level. The input signal Vtemp and the reference voltage Vref output from the sensor circuit and the reference power source RF, respectively, also gradually increase along with the increase in power supply voltage VDD, and hence the potential difference therebetween is small. The output signal Sg, which is obtained based on a comparison conducted between two signals with a small potential difference, continues to be in an unsteady state where the signal state may not be identified. In the interrupt condition reception circuit 20a, the control signal Scont is settled to a low level, and hence the output signal Vout is securely retained at a low level, with the result that a signal which exhibits an unnecessary detection state is not output.

At a time t3, the reference voltage Vref input from the reference power source RF reaches a predetermined voltage and is subjected to constant voltage control, which allows a constant voltage to be input. The power supply voltage VDD and the input signal Vtemp from the sensor circuit continue to increase in potential.

The reference voltage Vref exhibits a predetermined voltage while the reference voltage Vref exhibits a potential smaller than that of the input signal Vtemp, and hence the output signal Sg makes a transition from the unsteady state where the state is inconstant to a state capable of outputting a proper judgment result. Further, the output signal Vout remains to be under control of the control signal Scont and hence is securely retained at a low level, with the result that a signal which exhibits an unnecessary detection state is not output.

At a time t4, the input signal Vtemp from the sensor circuit makes a transition to a stationary operation state which exhibits a predetermined detection state. As a result, the input signal Vtemp is supposed to change according to a state detected by the sensor circuit, and the continued increase in input signal Vtemp along with the increase in power supply voltage VDD stops. Then, the power supply voltage VDD has increased to be higher in voltage value than the input signal Vtemp which is determined based on a current supplied by a constant current circuit provided to the sensor circuit and the impedance of the sensor circuit, and a change based on the input signal Vtemp from the sensor circuit may be detected.

At a time t5, the interrupt condition generating circuit 10a detects a predetermined potential difference occurring between the input signal Vtemp from the sensor circuit and the power supply voltage VDD, that is, a potential difference equal to or larger than the offset potential in the interrupt condition generating circuit 10a. The result of the detection indicates that the power supply voltage VDD has made a transition to a state where an operation-enabled power supply voltage may be supplied to the sensor circuit. In the interrupt condition generating circuit 10a, the interrupt state (low level) set to the control signal Scont is released, and hence the control signal Scont increases in voltage along with a potential increase of the power supply voltage VDD.

At a time t6, the power supply voltage VDD reaches a predetermined operation-enabled power supply voltage and stops increasing further, and hence the power supply voltage VDD starts to exhibit a constant value. Further, the voltage of the control signal Scont stops increasing, and makes a transition to a state where a constant value is exhibited.

As described above, each of the signals makes a state transition when power is turned on. The output signal Vout is securely retained at a low level until the power supply voltage VDD reaches a predetermined operation-enabled power supply voltage, with the result that a signal which exhibits an unnecessary detection state may not be output.

(Third Embodiment)

With reference to the accompanying drawings, another embodiment of the detection circuit which is different in configuration is described.

Figure 9:
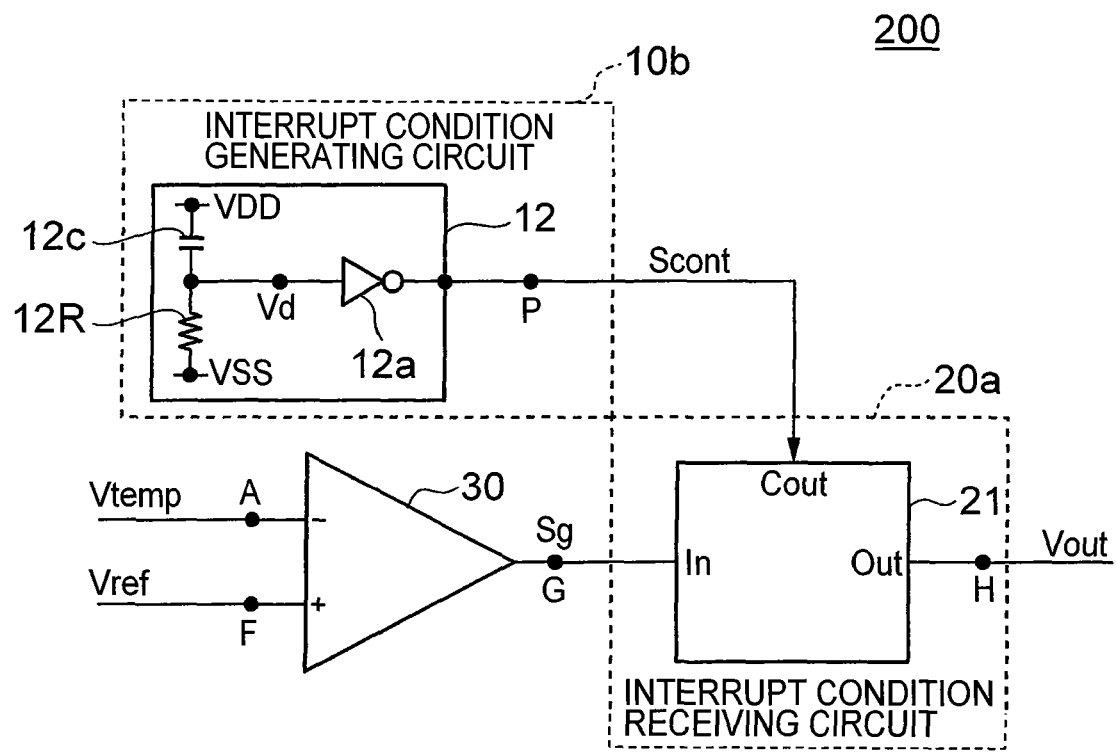
FIG. 9 is a schematic configuration diagram illustrating a detection circuit according to a third embodiment of the present invention.

FIG. 9 is a schematic configuration diagram illustrating a detection circuit 200 according to a third embodiment of the present invention. In the example illustrated in FIG. 9, the interrupt condition generating circuit 10a (circuit similar in configuration to the signal voltage monitoring circuit 4 illustrated in FIG. 1) according to the second embodiment illustrated in FIG. 7 is replaced by a power on clear (POC) circuit 12. The embodiments described later include a case where the POC circuit 12 illustrated in FIG. 9 and the interrupt condition generating circuit 10a illustrated in FIG. 7 are used in combination, and hence a description is given of an example of a detection circuit which uses the POC circuit 12 alone.

The detection circuit 200 illustrated in FIG. 9 includes an interrupt condition generating circuit 10b, the interrupt condition reception circuit 20a, and the comparator 30. Constituent elements similar to those of FIG. 7 are denoted by the same reference numerals and symbols, and a description is given of constituent elements different from those of FIG. 7.

The interrupt condition generating circuit 10b of the detection circuit 200 outputs a signal which retains an initial state for a predetermined time period when power is turned on. The interrupt condition generating circuit 10b includes a power on clear (POC) circuit 12. The POC circuit 12 is a so-called power-on initialization circuit. The POC circuit 12 includes a capacitor 12c and a resistor 12R connected in series. One terminal of the capacitor 12c is connected to a power source (power supply voltage VDD), and one terminal of the resistor 12R is connected to a reference power source (ground voltage VSS). A connection point between the capacitor 12c and the resistor 12R is connected to an input terminal of an inverter (NOT circuit) 12a, and the inverter 12a outputs the control signal Scont of the interrupt condition generating circuit 10b. The output terminal of the interrupt condition generating circuit 10b is connected to the control input terminal Cont of the interrupt condition reception circuit 20a.

In the detection circuit 200 configured as described above, the control signal Scont output from the interrupt condition generating circuit 10b exhibits a low level until a predetermined time period elapses after power is turned on, and exhibits a high level after a lapse of the predetermined time period.

The output signal Sg from the comparator 30 exhibits a high level when the voltage of the input signal Vtemp is lower than the reference voltage Vref. Meanwhile, the output signal Sg from the comparator 30 exhibits a low level when the voltage of the input signal Vtemp is higher than the reference voltage Vref.

In the case where the control signal Scont exhibits a low level, the interrupt condition reception circuit 20a fixedly outputs the output signal Vout at a low level, whereas in the case where the control signal Scont exhibits a high level, the interrupt condition reception circuit 20a outputs the output signal Sg from the comparator 30 as the output signal Vout, the output signal Sg being changed according to the input signal Vtemp.

Figure 10:
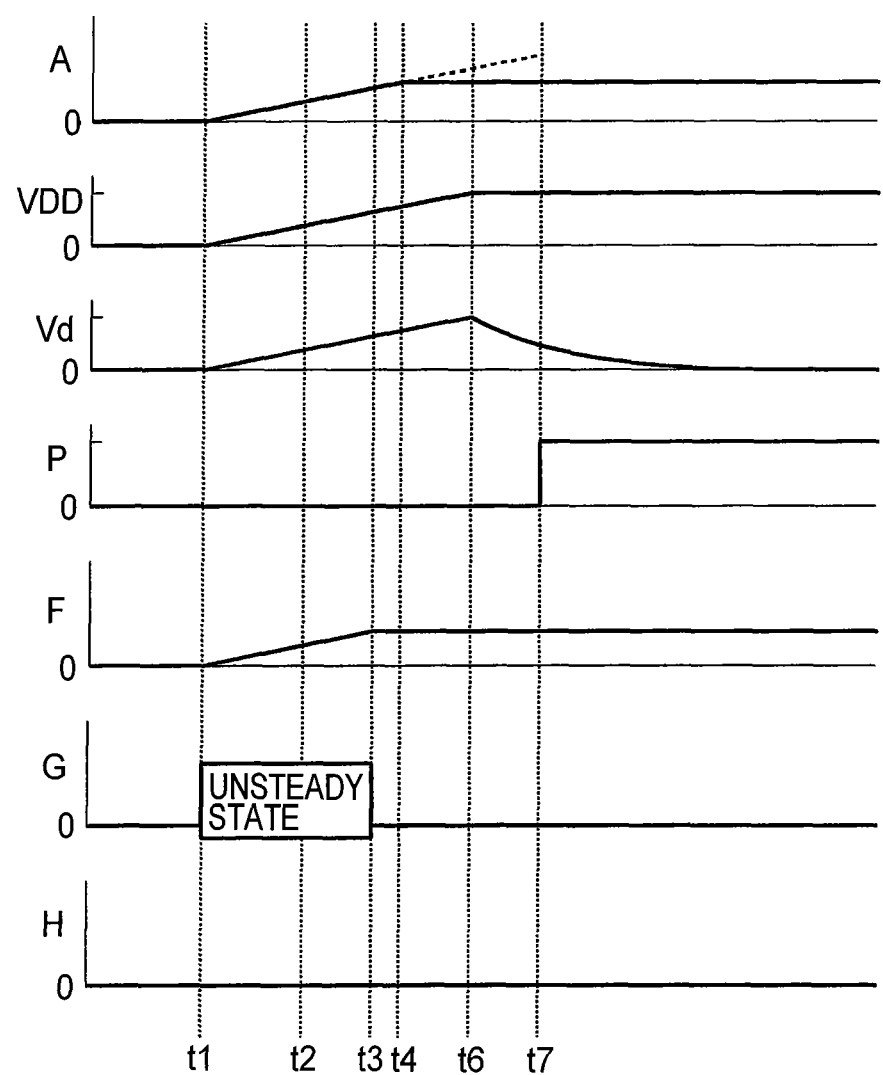
FIG. 10 is a timing chart for illustrating an operation of the detection circuit according to the third embodiment.

FIG. 10 is a timing chart for illustrating an operation of the detection circuit 200 according to the third embodiment.

With reference to points A, F, G, H, P, Vd, and VDD illustrated in the block diagram of FIG. 9, a signal transition at each of those points is described. The signals and times similar to those of FIG. 8 are denoted by the same reference symbols, and signals and times different from those of FIG. 8 are mainly described. The detection circuit 100 illustrated in FIG. 8 should be interpreted as the detection circuit 200.

A waveform at the point VDD shows a voltage transition of the power supply voltage VDD in the POC circuit 12. A waveform at the point Vd shows a voltage transition at a junction point Vd in a CR circuit of the POC circuit 12. A waveform at the point P shows a voltage transition of the control signal Scont which is output by the POC circuit 12 after being subjected to the judgment made by the POC circuit 12 in the interrupt condition generating circuit 10b. The interrupt condition reception circuit 20a is controlled based on the control signal Scont.

In the initial state illustrated in FIG. 10, the power has not been turned on and no electric charge is accumulated in each of the circuits, and hence the signals each exhibit a non-signal state.

At the time t1, the detection circuit 200, and the sensor circuit and the reference power source RF, which are connected to the detection circuit 200, are turned on. After that, the power supply voltage VDD gradually increases. The input signal Vtemp and the reference voltage Vref output from the sensor circuit and the reference power source RF, respectively, are equal in voltage to the power supply voltage VDD due to the operation of the current source, in a state where the power supply voltage VDD is low. The input signal Vtemp and the reference voltage Vref also gradually increase, along with the increase in power supply voltage VDD, exhibiting change characteristics similar to the power supply voltage VDD. The POC circuit 12 in the interrupt condition generating circuit 10b detects the power supply voltage VDD.

The capacitor 12c and the resistor 12R form a time constant circuit. Due to the time constant circuit, a potential at the point Vd changes according to a transient characteristic with a first order lag which is identified as a step response based on the power supply voltage VDD as an input. A potential at the point Vd increases following the power-on, but the control signal Scont still exhibits a low level because the inverter 12a has not been actuated.

The detection circuit 200 is in a transient state after power-on until the operation-enabled power supply voltage is supplied, and the state of the output signal Sg from the comparator 30 is unsteady and may not be identified.

On the other hand, the interrupt condition reception circuit 20a outputs a predetermined voltage as the output signal Vout without allowing the input signal to be output, until the power supply voltage VDD reaches the predetermined voltage. The predetermined voltage output as the output signal Vout is defined as a voltage which exhibits a non-detection state (released state) in the sensor circuit, and is controlled according to the control signal Scont. The control signal Scont is output at a low level, and hence the output signal Vout is securely retained at a low level, with the result that a signal which exhibits an unnecessary detection state is not output.

At the time t2, the power supply voltage VDD increases, and the circuits each make a transition to an operation-enabled state.

In the POC circuit 12 of the interrupt condition generating circuit 10b, a potential at the point Vd is higher than a threshold potential in the inverter 12a. As the power supply voltage VDD to the inverter 12a transiently increases, the threshold potential of the inverter 12a increases along with the increase in power supply voltage VDD. Accordingly, the control signal Scont is settled to a low level. The input signal Vtemp and the reference voltage Vref output from the sensor circuit and the reference power source RF, respectively, also gradually increase along with the increase in power supply voltage VDD, and hence the potential difference therebetween is small. The output signal Sg, which is obtained based on a comparison conducted between the two signals with a small potential difference, continues to be in an unsteady state where the signal state may not be identified. In the interrupt condition reception circuit 20a, the control signal Scont is settled to a low level, and hence the output signal Vout is securely retained at a low level, with the result that a signal which exhibits an unnecessary detection state is not output.

At the time t3, the reference voltage Vref input from the reference power source RF reaches a predetermined voltage and is subjected to constant voltage control, which allows a constant voltage to be input. The power supply voltage VDD and a potential of the input signal Vtemp from the sensor circuit continue to increase.

The reference voltage Vref exhibits a predetermined voltage while the reference voltage Vref exhibits a potential smaller than that of the input signal Vtemp, and hence the output signal Sg makes a transition from the unsteady state where the state is inconstant to a state capable of outputting a proper judgment result. Further, the output signal Vout remains to be under control of the control signal Scont and hence is securely retained at a low level, with the result that a signal which exhibits an unnecessary detection state is not output.

At the time t4, the input signal Vtemp from the sensor circuit makes a transition to a stationary operation state which exhibits a predetermined detection state. As a result, the input signal Vtemp is supposed to change according to a state detected by the sensor circuit, and the continued increase in input signal Vtemp along with the increase in power supply voltage VDD stops. Then, the power supply voltage VDD has increased to be higher in voltage value than the input signal Vtemp which is determined based on a current supplied by a constant current circuit provided to the sensor circuit and the impedance of the sensor circuit, and a change based on the input signal Vtemp from the sensor circuit may be detected.

At the time t6, the power supply voltage VDD reaches a predetermined operation-enabled power supply voltage and stops increasing further, and hence the power supply voltage VDD starts to exhibit a constant value. Further, the potential of the control signal Scont stops increasing, and makes a transition to a state where a constant value is exhibited.

In the POC circuit 12 of the interrupt condition generating circuit 10b, the power supply voltage VDD has made a state transition to be subjected to constant voltage control, and hence a potential increase at the point Vd stops and starts to decline.

At a time t7, in the POC circuit 12 of the interrupt condition generating circuit 10b, when a potential at the point Vd is reduced to be equal to or lower than the threshold voltage of the inverter 12a, the control signal Scont makes a transition to a high level. The interrupt condition generating circuit 10b releases the interrupt state (low level) set to the control signal that has been output as the control signal Scont. As a result, the detection circuit 200 makes a transition to a normal state capable of outputting a detection signal.

As described above, each of the signals makes a state transition when power is turned on. The output signal Vout is securely retained at a low level until the power supply voltage VDD reaches a predetermined operation-enabled power supply voltage, with the result that a signal which exhibits an unnecessary detection state may not be output.

(Fourth Embodiment)

With reference to the accompanying drawings, another embodiment of the detection circuit which is different in configuration is described.

Figure 11:
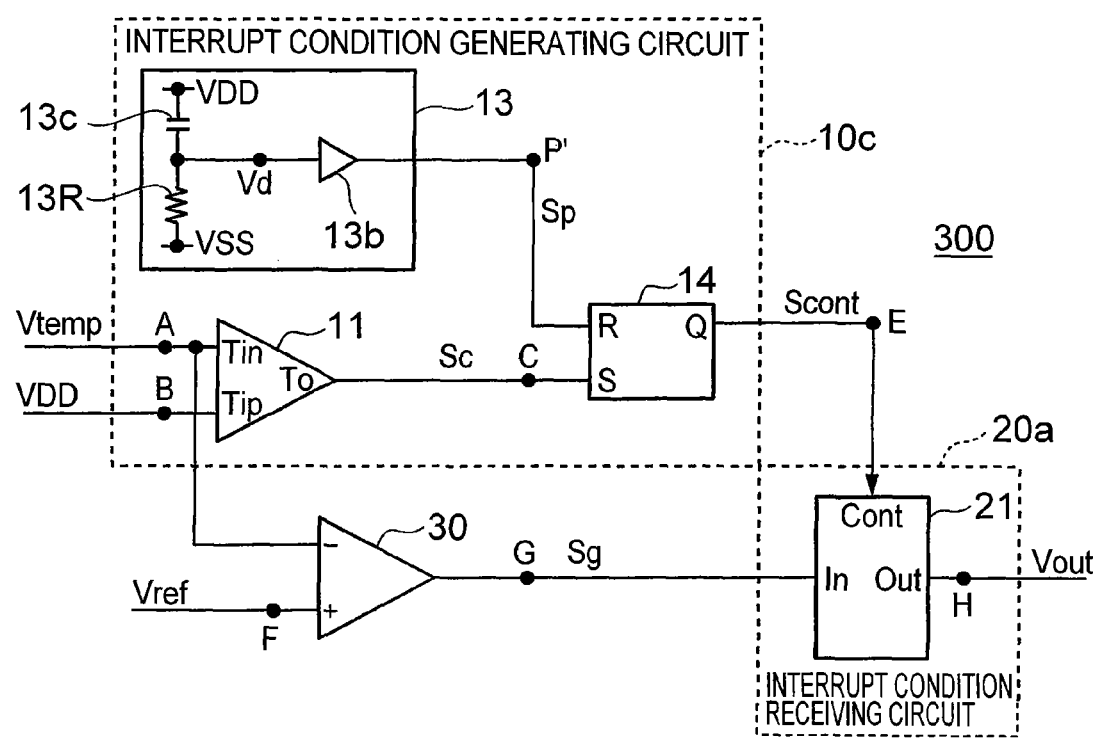
FIG. 11 is a schematic configuration diagram illustrating a detection circuit according to a fourth embodiment of the present invention.

FIG. 11 is a schematic configuration diagram illustrating a detection circuit 300 according to a fourth embodiment of the present invention.

The detection circuit 300 includes an interrupt condition generating circuit 10c, the interrupt condition reception circuit 20a, and the comparator 30. Constituent elements similar to those of FIGS. 7 and 9 are denoted by the same reference numerals and symbols, and a description is given of constituent elements different from those of FIGS. 7 and 9.

In the detection circuit 300, the interrupt condition generating circuit 10c includes the offset comparator 11, a POC circuit 13, and a Reset Set (RS) flip-flop 14.

The POC circuit 13 includes a so-called power-on initialization circuit. The POC circuit 13 includes a capacitor 13c and a resistor 13R connected in series. One terminal of the capacitor 13c is connected to a positive terminal of a power source (power supply voltage VDD), and one terminal of the resistor 13R is connected to a negative terminal of the power source (ground voltage VSS). A connection point between the capacitor 13c and the resistor 13R is connected to an input terminal of a buffer 13b. When a voltage (voltage at the point Vd) input to the buffer 13b is equal to or larger than a threshold voltage (inverted voltage) of the buffer 13b, a signal Sp' output from the buffer 13b is set to a high level exhibited by the power supply voltage VDD, and when the voltage is equal to or less than the threshold value (inverted voltage), the signal Sp' is set to a low level exhibited by the reference voltage VSS. A signal output from the buffer 13b serves as an output signal from the POC circuit 13. When a voltage at the point Vd becomes equal to or larger than the inverted voltage of the buffer 13b, the signal Sp' corresponds to the power supply voltage VDD, and when the voltage becomes equal to or lower than the inverted voltage, the signal Sp' corresponds to the reference voltage VSS. The threshold voltage of the buffer 13b is half of the power supply voltage VDD. The offset comparator 11 outputs a signal Sc. The signal Sc corresponds to the control signal Scont of the first and second embodiments. The RS flip-flop 14 includes an RS-type flip-flop.

The offset comparator 11 has an output terminal thereof connected to a set input terminal (S) of the RS flip-flop 14, the POC circuit 13 has an output terminal thereof connected to a reset input terminal (R) of the RS flip-flop 14, and the RS flip-flop 14 outputs a signal, from an output terminal thereof, as the control signal Scont of the interrupt condition generating circuit 10c. When a high level is input to the set input terminal (S), an output signal from the RS flip-flop 14 is set to a high level (set). When a high level is input to the reset input terminal (R), the output signal is set to a low level (reset). When a high level is input to both of the terminals, the reset request is prioritized, and the output signal is set to a low level (reset).

In the detection circuit 300 configured as described above, the control signal Scont output from the interrupt condition generating circuit 10c exhibits a low level in a case where the power supply voltage VDD is lower than a potential obtained by adding the bias potential Vb to the voltage of the input signal Vtemp. Meanwhile, the control signal Scont exhibits a high level in a case where the power supply voltage VDD is higher than a potential obtained by adding the bias potential Vb to the voltage of the input signal Vtemp.

The control signal Scont output from the interrupt condition generating circuit 10c exhibits a high level until a predetermined time period elapses after power is turned on, and exhibits a low level after a lapse of the predetermined time period.

The output signal Sg from the comparator 30 exhibits a high level when the voltage of the input signal Vtemp is lower than the reference voltage Vref. Meanwhile, the output signal Sg from the comparator 30 exhibits a low level when the voltage of the input signal Vtemp is higher than the reference voltage Vref.

In the case where the control signal Scont exhibits a low level, the interrupt condition reception circuit 20a fixedly outputs the output signal Vout at a low level, whereas in the case where the control signal Scont exhibits a high level, the interrupt condition reception circuit 20a outputs the output signal Sg from the comparator 30 as the output signal Vout, the output signal Sg being changed according to the input signal Vtemp.

Figure 12:
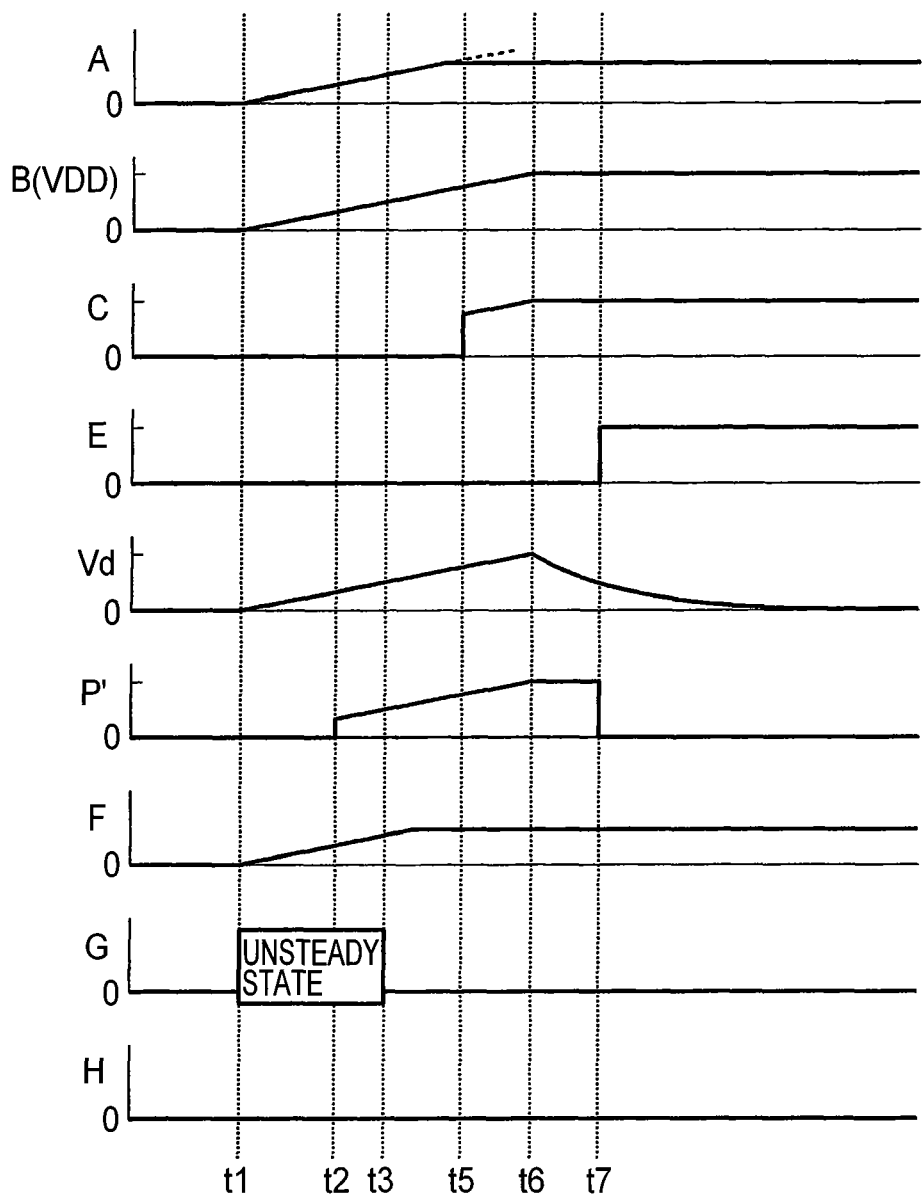
FIG. 12 is a timing chart for illustrating an operation of the detection circuit according to the fourth embodiment.

FIG. 12 is a timing chart for illustrating an operation of the detection circuit 300 according to the fourth embodiment.

With reference to points A, B (VDD), C, E, F, G, H, P', and Vd illustrated in the block diagram of FIG. 11, a signal transition at each of those points is described. The signals and times similar to those of FIGS. 8 and 10 are denoted by the same reference symbols, and signals and times different from those of FIGS. 8 and 10 are mainly described. The detection circuit 100 illustrated in FIG. 8 and the detection circuit 200 illustrated in FIG. 10 should be interpreted as the detection circuit 300.

A waveform at the point C shows a voltage transition of the signal Sc output from the offset comparator 11 of the interrupt condition generating circuit 10c. A waveform at the point E shows the control signal Scont output from the RS flip-flop 14 of the interrupt condition generating circuit 10c. A waveform at the point P' shows a voltage transition of the signal Sp' output from the POC circuit 13 of the interrupt condition generating circuit 10c.

In the initial state illustrated in FIG. 12, the power has not been turned on and no electric charge is accumulated in each of the circuits, and hence the signals each exhibit a non-signal state.

At the time t1, the detection circuit 300, and the sensor circuit and the reference power source RF, which are connected to the detection circuit 300, are turned on. After that, the power supply voltage VDD gradually increases. The input signal Vtemp and the reference voltage Vref output from the sensor circuit and the reference power source RF, respectively, are equal in voltage to the power supply voltage VDD due to the operation of the current source, in a state where the power supply voltage VDD is low. The input signal Vtemp and the reference voltage Vref also gradually increase, along with the increase in power supply voltage VDD, exhibiting change characteristics similar to the power supply voltage VDD.

The detection circuit 300 is in a transient state after power-on until the operation-enabled power supply voltage is supplied, and the state of the output signal Sg from the comparator 30 is unsteady and may not be identified.

In the interrupt condition generating circuit 10c, the offset comparator 11 makes a judgment on input signals by comparing one of the signals with another, the one of the signals being applied with an offset potential. Accordingly, even when the potential difference between the input signals is small, a result of the judgment is output based on the comparison using the potential thus offset, without leading to an unsteady state. As a result, the signal Sc exhibits a low level.

The POC circuit 13 detects the power supply voltage VDD. A potential at the point Vd increases following the power-on, but the signal Sp' still exhibits a low level because the buffer 13b has not been actuated. The RS flip-flop 14 receives an input of low level at the set input terminal (S) and an input of low level at the reset input terminal (R), but has not been actuated, and therefore the control signal Scont still exhibits a low level, retaining the initial state.

On the other hand, the interrupt condition reception circuit 20a outputs a predetermined voltage as the output signal Vout without allowing the input signal to be output, until the power supply voltage reaches the predetermined voltage. The predetermined voltage output as the output signal Vout is defined as a voltage which exhibits a non-detection state (released state) in the sensor circuit, and is controlled according to the control signal Scont. The control signal Scont is output at a low level, and hence the output signal Vout is securely retained at a low level, with the result that a signal which exhibits an unnecessary detection state is not output.

At the time t2, the power supply voltage VDD increases, and the circuits each make a transition to an operation-enabled state.

In the offset comparator 11 of the interrupt condition generating circuit 10c, despite a small potential difference between the input signal Vtemp and the power supply voltage VDD, the signal Sc is settled to a low level because one of the signals is applied with an offset potential. In the POC circuit 13, a voltage of a signal at the point Vd is higher than the threshold potential of the buffer 13b. As the power supply voltage VDD to the buffer 13b transiently increases, the threshold potential of the buffer 13b increases along with the increase in power supply voltage VDD. As a result, the signal Sp' is output at a high level. In the RS flip-flop 14, the set input terminal (S) receives an input of low level and the reset input terminal (R) receives an input of high level, with the result that a signal of low level is output as the control signal Scont from the output terminal (Q).

The input signal Vtemp and the reference voltage Vref output from the sensor circuit and the reference power source RF, respectively, also gradually increase, along with the increase in power supply voltage VDD, and hence the potential difference therebetween is small. The output signal Sg, which is obtained based on a comparison conducted between two signals with a small potential difference, continues to be in an unsteady state where the signal state may not be identified. In the interrupt condition reception circuit 20a, the control signal Scont is settled to a low level, and hence the output signal Vout is securely retained at a low level, with the result that a signal which exhibits an unnecessary detection state is not output.

At the time t3, the input from the reference power source RF represented by the reference voltage Vref reaches a predetermined voltage and then is subjected to constant voltage control, which allows a constant voltage to be input. The power supply voltage VDD and a potential of the input signal Vtemp from the sensor circuit continue to increase.

The reference voltage Vref exhibits a predetermined voltage while the reference voltage Vref exhibits a potential smaller than that of the input signal Vtemp, and hence the output signal Sg makes a transition from the unsteady state where the state is inconstant to a state capable of outputting a proper judgment result. Further, the output signal Vout remains to be under control of the control signal Scont and hence is securely retained at a low level, with the result that a signal which exhibits an unnecessary detection state is not output.

At the time t4, the input signal Vtemp from the sensor circuit makes a transition to a stationary operation state which exhibits a predetermined detection state. As a result, the input signal Vtemp is supposed to change according to a state detected by the sensor circuit, and the continued increase in input signal Vtemp along with the increase in power supply voltage VDD stops. Then, the power supply voltage VDD has increased to be higher in voltage value than the input signal Vtemp which is determined based on a current supplied by a constant current circuit provided to the sensor circuit and the impedance of the sensor circuit, and a change based on the input signal Vtemp from the sensor circuit may be detected.

At the time t5, the offset comparator 11 of the interrupt condition generating circuit 10c detects a predetermined potential difference occurring between the input signal Vtemp from the sensor circuit and the power supply voltage VDD, that is, a potential difference equal to or larger than the offset potential in the interrupt condition generating circuit 10c. The result of the detection indicates that the power supply voltage VDD has made a transition to a state where an operation-enabled power supply voltage may be supplied to the sensor circuit.

The offset comparator 11 outputs the signal Sc at a high level, and the potential of the signal Sc increases along with the potential increase of the power supply voltage VDD. In the RS flip-flop 14, the set input terminal (S) receives an input of high level and the reset input terminal (R) receives an input of high level, with the result that a signal at a low level is output from the output terminal (Q). Further, the output signal Vout remains to be under control of the control signal Scont and hence is securely retained at a low level, with the result that a signal which exhibits an unnecessary detection state is not output.

At the time t6, the power supply voltage VDD reaches a predetermined operation-enabled power supply voltage and stops increasing further, and hence the power supply voltage VDD starts to exhibit a constant value. Further, the signal Sc and other signals stop increasing, and make a transition to a state where a constant value is exhibited. In the POC circuit 13 of the interrupt condition generating circuit 10c, a potential of a signal at the point Vd drops. A signal at the point Vd is judged by the buffer 13b, with a voltage which is half the power supply voltage VDD being set as the threshold voltage, and the signal Sp' is output at a high level.

In the RS flip-flop 14 of the interrupt condition generating circuit 10c, the state of input signals remains unchanged, and the set input terminal (S) receives an input of high level and the reset input terminal (R) receives an input of high level, with the result that the output terminal (Q) still outputs a signal at a low level. The interrupt condition generating circuit 10c continues to output the control signal Scont at a low level, to thereby sustain the interrupt state (low level). Further, the output signal Vout remains to be under control of the control signal Scont and hence is securely retained at a low level, with the result that a signal which exhibits an unnecessary detection state is not output.

At the time t7, in the POC circuit 13 of the interrupt condition generating circuit 10c, when a potential of a signal at the point Vd is reduced to be equal to or lower than the threshold voltage of the buffer 13b (voltage which is half the power supply voltage VDD), the signal Sp' makes a transition to a low level. In the RS flip-flop 14, the set input terminal (S) receives an input of high level and the reset input terminal (R) receives an input of low level, with the result that the output terminal (Q) outputs a signal at a high level, to thereby output the control signal Scont.

The interrupt condition generating circuit 10c sets the control signal Scont to the interrupt-released state (high level). As a result, the detection circuit 300 makes a transition to a normal state capable of outputting a detection signal, and switches to a state where the output signal Sg may be output so as to serve as an input to the interrupt condition reception circuit 20a. The output signal Sg is at a low level, and hence the output signal Vout is securely retained at a low level, with the result that a signal which exhibits an unnecessary detection state is not output.

As described above, each of the signals makes a state transition when power is turned on. The output signal Vout is securely retained at a low level until the power supply voltage VDD reaches a predetermined operation-enabled power supply voltage, with the result that a signal which exhibits an unnecessary detection state may not be output.

(Fifth Embodiment)

With reference to the accompanying drawings, another embodiment of the detection circuit which is different in configuration is described.

Figure 13:
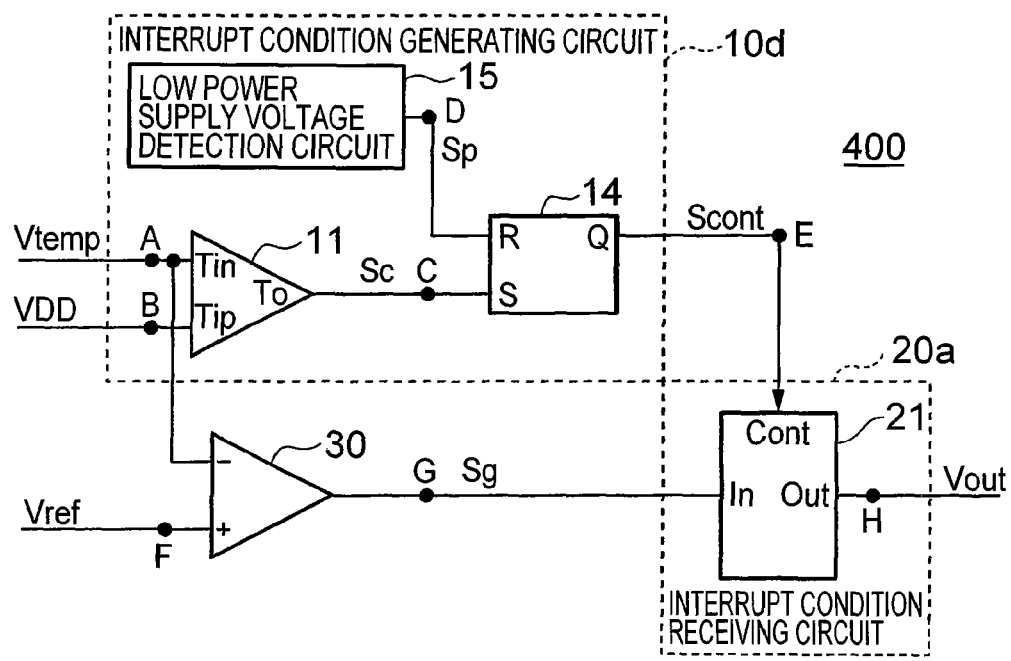
FIG. 13 is a schematic configuration diagram illustrating a detection circuit according to a fifth embodiment of the present invention.

FIG. 13 is a schematic configuration diagram illustrating a detection circuit 400 according to a fifth embodiment of the present invention.

The detection circuit 400 includes an interrupt condition generating circuit 10d, the interrupt condition reception circuit 20a, and the comparator 30. Constituent elements similar to those of FIGS. 7 and 11 are denoted by the same reference numerals and symbols, and a description is given of constituent elements different from those of FIGS. 7 and 11.

In the detection circuit 400, the interrupt condition generating circuit 10d includes the offset comparator 11, the RS flip-flop 14, and a low power supply voltage detection circuit 15.

The low power supply voltage detection circuit 15 detects a drop in the power supply voltage.

Figure 14:
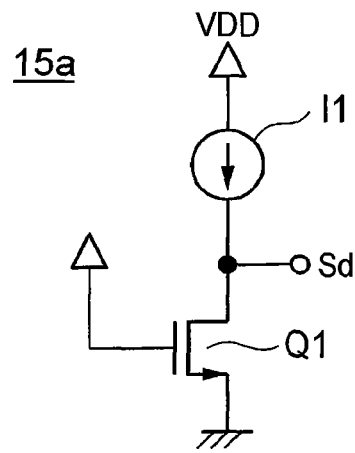
FIG. 14 is a schematic configuration diagram illustrating a low power supply voltage detection circuit according to the fifth embodiment.

FIG. 14 is a schematic configuration diagram illustrating an example of the low power supply voltage detection circuit 15.

The low power supply voltage detection circuit 15 illustrated in FIG. 14 includes a transistor Q1 and a constant current source I1.

The transistor Q1 includes an n-channel metal oxide semiconductor field effect transistor (NMOSFET). The transistor Q1 has a gate thereof connected to a positive terminal of a power source (power supply voltage VDD), a source thereof connected to a negative terminal of the power source (ground voltage VSS), and a drain thereof connected to one terminal of the constant current source I1 that has another terminal thereof connected to the positive terminal of the power source. That is, the transistor Q1 forms a common source amplifier circuit with the constant current source I1 as a load.

Figure 15A:
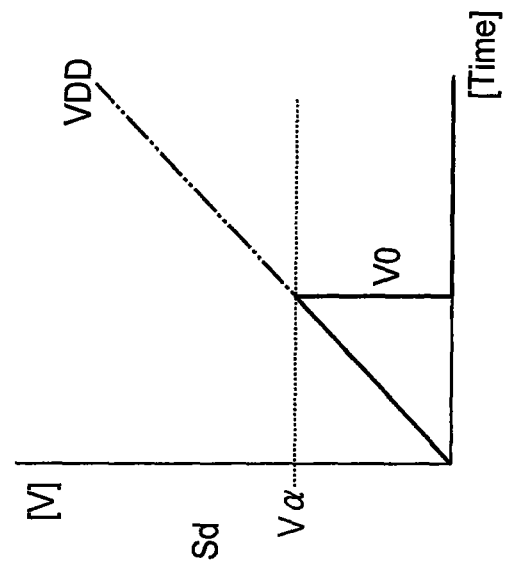
FIGS. 15A and 15B are graphs for illustrating an operation of the low power supply voltage detection circuit according to the fifth embodiment.
Figure 15B:
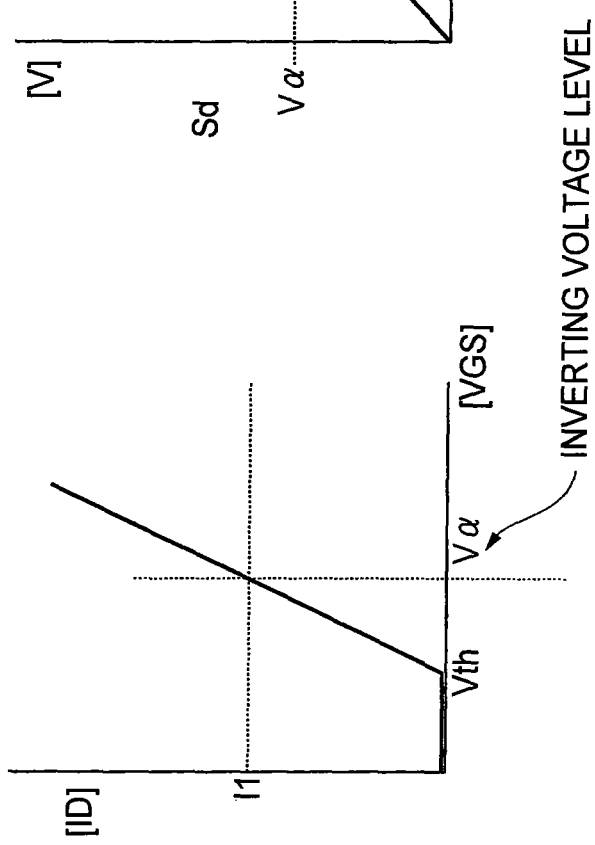

FIGS. 15A and 15B are graphs for illustrating an operation of the low power supply voltage detection circuit 15 illustrated in FIG. 14.

FIG. 15A is a graph illustrating an amplification characteristic of the transistor Q1, in which a gate-source voltage (VGS) in the transistor Q1 is plotted along the abscissa thereof and a drain current (ID) is plotted along the ordinate thereof. An intercept Vth on the abscissa of the graph represents a threshold voltage of the gate-source voltage VGS in the transistor Q1. As illustrated in the graph, in a state where the gate-source voltage VGS in the transistor Q1 is equal to or lower than a predetermined voltage Vα, the transistor Q1 does not reach saturation and a constant current i1 set to the constant current source I1 is not allowed to flow therethrough. On the other hand, in a state where the gate-source voltage VGS has exceeded a predetermined voltage Vα, the transistor Q1 becomes saturated.

FIG. 15B is a timing chart illustrating a change in signal Sd, which occurs through the application of the power supply voltage VDD, which gradually increases due to the characteristic exhibited by the circuit configuration described above.

The voltage of the signal Sd makes a transition along with the change in power supply voltage VDD until the voltage VDD reaches the voltage Vα. When the power supply voltage VDD reaches the voltage Vα, the signal Sd makes a transition to a state where the signal exhibits a low level.

Referring again to FIG. 13, a connection state of the interrupt condition generating circuit 10d is described.

The offset comparator 11 has an output terminal thereof connected to the set input terminal (S) of the RS flip-flop 14, the low power supply voltage detection circuit 15 has an output terminal thereof connected to the reset input terminal (R) of the RS flip-flop 14, and the RS flip-flop 14 outputs, from an output terminal thereof, an output signal of the interrupt condition generating circuit 10d.

Figure 16:
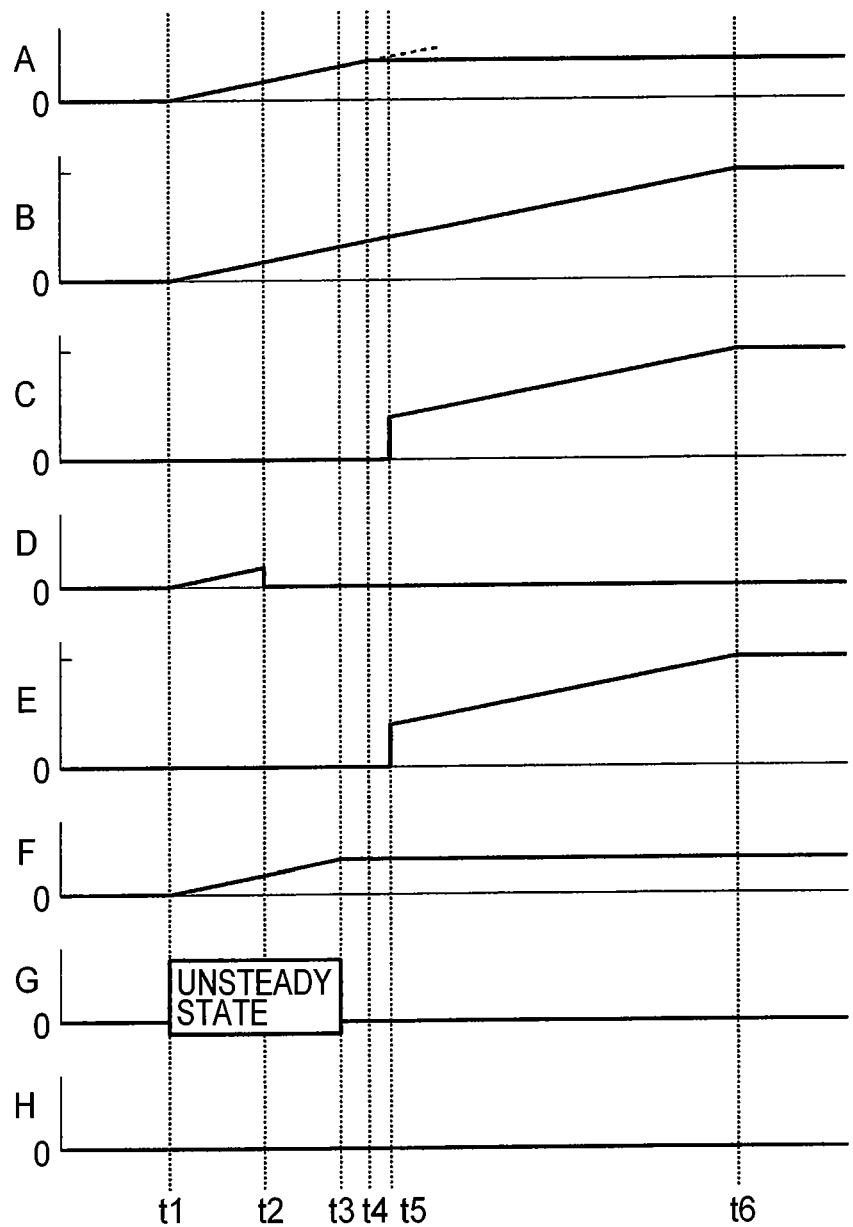
FIG. 16 is a timing chart for illustrating an operation of the detection circuit according to the fifth embodiment.

FIG. 16 is a timing chart for illustrating an operation of the detection circuit 400 according to the fifth embodiment.

With reference to points A to H illustrated in the block diagram of FIG. 13, a signal transition at each of those points is described. The signals and times similar to those of FIGS. 8, 10, and 14 are denoted by the same reference symbols, and signals and times different from those of FIGS. 8, 10, and 14 are mainly described. The detection circuit 100 illustrated in FIG. 8, the detection circuit 200 illustrated in FIG. 10, and the detection circuit 300 illustrated in FIG. 14 are interpreted as the detection circuit 400.

A waveform at the point D shows the signal Sd output from the low power supply voltage detection circuit 15.

In the initial state illustrated in FIG. 16, the power has not been turned on and no electric charge is accumulated in each of the circuits. Hence, the signals each exhibit a non-signal state.

At the time t1, the detection circuit 400, and the sensor circuit and the reference power source RF, which are connected to the detection circuit 400, are powered on. After that, the power supply voltage VDD gradually increases. The input signal Vtemp and the reference voltage Vref output from the sensor circuit and the reference power source RF, respectively, are equal in voltage to the power supply voltage VDD due to the operation of the current source, in a state where the power supply voltage VDD is low. The input signal Vtemp and the reference voltage Vref also gradually increase, along with the increase in power supply voltage VDD, exhibiting change characteristics similar to the power supply voltage VDD.

The detection circuit 400 is in a transient state after power-on until the operation-enabled power supply voltage is supplied, and the state of the output signal Sg from the comparator 30 is unsteady and may not be identified.

In the interrupt condition generating circuit 10d, the offset comparator 11 makes a judgment on input signals by comparing one of the signals with another, the one of the signals being applied with an offset potential. Accordingly, even when the potential difference between the input signals is small, a result of the judgment is output based on the comparison using the potential thus offset, without leading to an unsteady state. As a result, the signal Sc exhibits a low level.

In the low power supply voltage detection circuit 15, the power supply voltage is lower than a threshold potential in semiconductor elements (such as the transistors Q1 and Q2) which form the circuit, and the signal Sd increases in voltage along with the increase in power supply voltage. In the RS flip-flop 14, the set input terminal (S) receives an input of low level, and the reset input terminal (R) receives an input of low level. The RS flip-flop 14 is not actuated yet and hence the control signal Scont is output at a low level with the initial state maintained.

On the other hand, the interrupt condition reception circuit 20a outputs a predetermined voltage as the output signal Vout without allowing the input signal to be output, until the power supply voltage reaches the predetermined voltage. The predetermined voltage output as the output signal Vout is defined as a voltage which exhibits a non-detection state (released state) in the sensor circuit, and is controlled according to the control signal Scont. As the control signal Scont, the signal at a low level is output, and hence the output signal Vout is securely retained at a low level, with the result that a signal which exhibits an unnecessary detection state is not output.

At the time t2, the power supply voltage VDD increases, and the circuits each make a transition to an operation-enabled state.

In the offset comparator 11 of the interrupt condition generating circuit 10d, despite a small potential difference between the input signal Vtemp and the power supply voltage VDD, the signal Sc is settled to a low level because one of the signals is applied with an offset potential. In the low power supply voltage detection circuit 15, the power supply voltage is higher than the threshold potential in the semiconductor elements (such as the transistors Q1 and Q2) which form the circuit, and the signal Sd is output at a low level because the power supply voltage has exceeded a predetermined threshold voltage. In the RS flip-flop 14, the set input terminal (S) receives an input of low level, and the reset input terminal (R) receives an input of low level. The RS flip-flop 14 is actuated and hence the control signal Scont is output at a low level according to the state of the input signals.

The input signal Vtemp and the reference voltage Vref output from the sensor circuit and the reference power source RF, respectively, also gradually increase along with the increase in power supply voltage VDD, and hence the potential difference therebetween is small. The output signal Sg, which is obtained based on a comparison conducted between two signals with a small potential difference, continues to be in an unsteady state where the signal state may not be identified. In the interrupt condition reception circuit 20a, the control signal Scont is settled to a low level, and hence the output signal Vout is securely retained at a low level, with the result that a signal which exhibits an unnecessary detection state is not output.

At the time t3, the input from the reference power source RF represented by the reference voltage Vref reaches a predetermined voltage and then is subjected to constant voltage control, which allows a constant voltage to be input. The power supply voltage VDD and a potential of the input signal Vtemp from the sensor circuit continue to increase.

The reference voltage Vref exhibits a predetermined voltage while the reference voltage Vref exhibits a potential smaller than that of the input signal Vtemp, and hence the output signal Sg makes a transition from the unsteady state where the state is inconstant to a state capable of outputting a proper judgment result. Further, the output signal Vout remains to be under control of the control signal Scont and hence is securely retained at a low level, with the result that a signal which exhibits an unnecessary detection state is not output.

At the time t4, the input signal Vtemp from the sensor circuit makes a transition to a stationary operation state which exhibits a predetermined detection state. As a result, the input signal Vtemp is supposed to change according to a state detected by the sensor circuit, and the continued increase in input signal Vtemp along with the increase in power supply voltage VDD stops. Then, the power supply voltage VDD has increased to be higher in voltage value than the input signal Vtemp which is determined based on a current supplied by a constant current circuit provided to the sensor circuit and the impedance of the sensor circuit, and a change based on the input signal Vtemp from the sensor circuit may be detected.

At the time t5, the offset comparator 11 of the interrupt condition generating circuit 10d detects a predetermined potential difference occurring between the input signal Vtemp from the sensor circuit and the power supply voltage VDD, that is, a potential difference equal to or larger than the offset potential in the interrupt condition generating circuit 10d. The result of the detection indicates that the power supply voltage VDD has made a transition to a state where an operation-enabled power supply voltage may be supplied to the sensor circuit.

The offset comparator 11 outputs the signal Sc at a high level, which increases along with the potential increase in power supply voltage VDD. In the RS flip-flop 14, the set input terminal (S) receives an input of high level while the reset input terminal (R) receives an input of low level, with the result that the output is inverted so that the signal at a high level is output. The interrupt condition generating circuit 10d releases the interrupt state (low level) set to the control signal Scont. As a result, the detection circuit 400 makes a transition to a normal state capable of outputting a detection signal.

At the time t6, the power supply voltage VDD reaches a predetermined operation-enabled power supply voltage and stops increasing further, and hence the power supply voltage VDD starts to exhibit a constant value. Further, the increase in voltage of the signal Sc and other signals along with the increase in power supply voltage is stopped, and the signals make a transition to a state where a constant value is exhibited.

As described above, each of the signals makes a state transition when power is turned on. The output signal Vout is securely retained at a low level until the power supply voltage VDD reaches a predetermined operation-enabled power supply voltage, with the result that a signal which exhibits an unnecessary detection state may not be output.

(Sixth Embodiment)

With reference to the accompanying drawings, another embodiment of the low power supply voltage detection circuit which is different in configuration is described.

Figure 17:
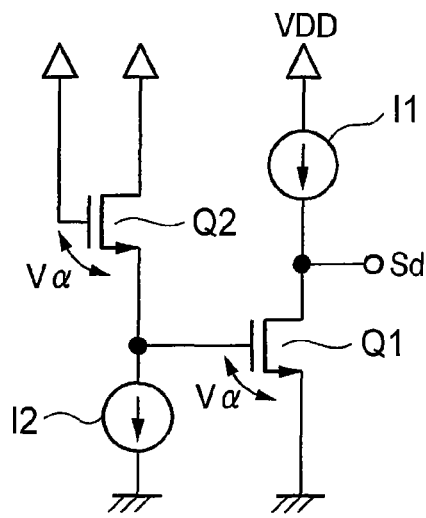
FIG. 17 is a schematic configuration diagram illustrating a low power supply voltage detection circuit according to a sixth embodiment of the present invention.

FIG. 17 is a schematic configuration diagram illustrating a low power supply voltage detection circuit 15b according to a sixth embodiment of the present invention.

The low power supply voltage detection circuit 15b illustrated in FIG. 17 includes the transistors Q1 and Q2, and the constant current sources I1 and I2.

The transistors Q1 and Q2 each include an n-channel metal oxide semiconductor field effect transistor (NMOSFET). The transistor Q2 has a gate and a drain thereof connected to the positive terminal of a power source (power supply voltage VDD), and a source thereof connected to one terminal of the constant current source I2 which is connected, at another terminal thereof, to the negative terminal of the power source (ground voltage VSS).

The transistor Q1 has a gate thereof connected to the source of the transistor Q2, a source thereof connected to the ground voltage VSS, and a drain thereof connected to one terminal of the constant current source I1 which is connected, at another terminal thereof, to the positive terminal of the power source. That is, the transistors Q1 and Q2 form a multistage amplifier circuit, in which a common source amplifier circuit including the constant current source I1 as a load is used as an output stage.

Figure 18A:
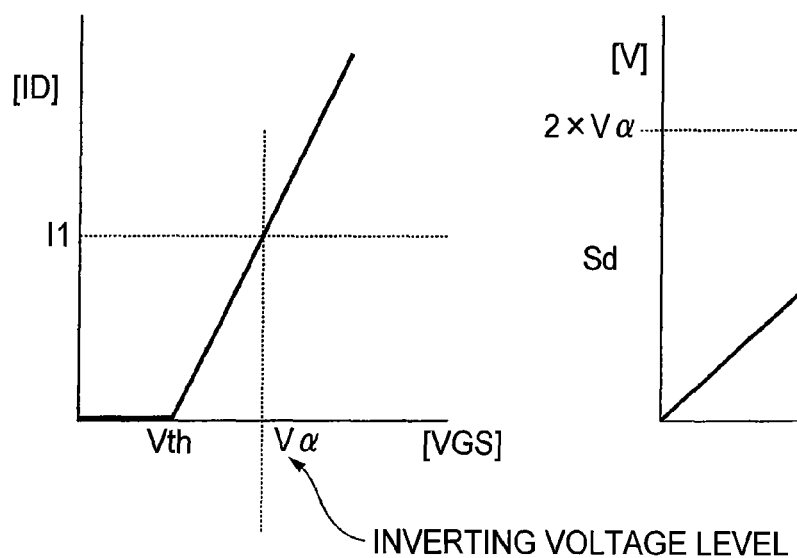
FIGS. 18A and 18B are graphs for illustrating an operation of the low power supply voltage detection circuit according to the sixth embodiment.
Figure 18B:
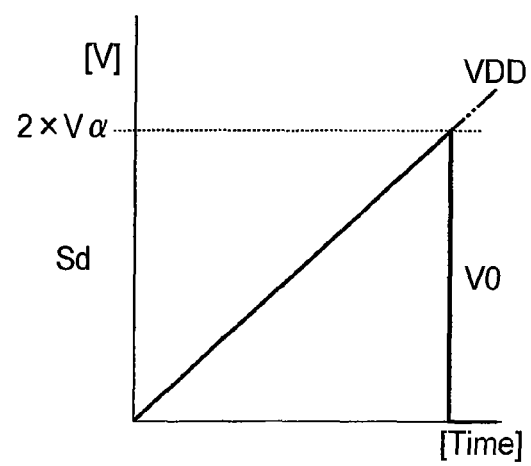

FIGS. 18A and 18B are graphs for illustrating an operation of the low power supply voltage detection circuit 15b according to the sixth embodiment.

FIG. 18A is a graph illustrating an amplification characteristic of the transistor Q1 (Q2), in which a gate-source voltage (VGS) in the transistor Q1 (Q2) is plotted along the abscissa thereof and a drain current (ID) is plotted along the ordinate thereof. An intercept Vth on the abscissa of the graph represents a threshold voltage of the gate-source voltage VGS in the transistor Q1 (Q2). As illustrated in the graph, in a state where the gate-source voltage VGS in the transistor Q1 (Q2) is equal to or lower than a predetermined voltage Vα, the transistor Q1 (Q2) becomes an off (shut-off) state in which a current set as the constant current source I1 is not allowed to flow therethrough. On the other hand, in a state where the gate-source voltage VGS has exceeded the predetermined voltage Vα, the transistor Q1 (Q2) becomes an on (conduction) state. It should be noted that the transistors Q1 and Q2 may be different from each other in characteristics.

FIG. 18B is a timing chart illustrating a change in signal Sd, which occurs through the application of the power supply voltage VDD, which gradually increases due to the characteristic exhibited by the circuit configuration described above.

A voltage of the signal Sd makes a transition along with a change in power supply voltage VDD until the power supply voltage VDD reaches a voltage (2×Vα). When the power supply voltage VDD reaches the voltage (2×Vα), the signal Sd makes a transition to a state where the signal exhibits a low level. The transistors Q1 and Q2 are connected in multistage configuration, and hence the threshold voltage for the low power supply detection voltage may be doubled as compared to the case where the transistor is provided in a single stage.

(Seventh Embodiment)

With reference to the accompanying drawings, another embodiment of the detection circuit which is different in configuration is described.

Figure 19:
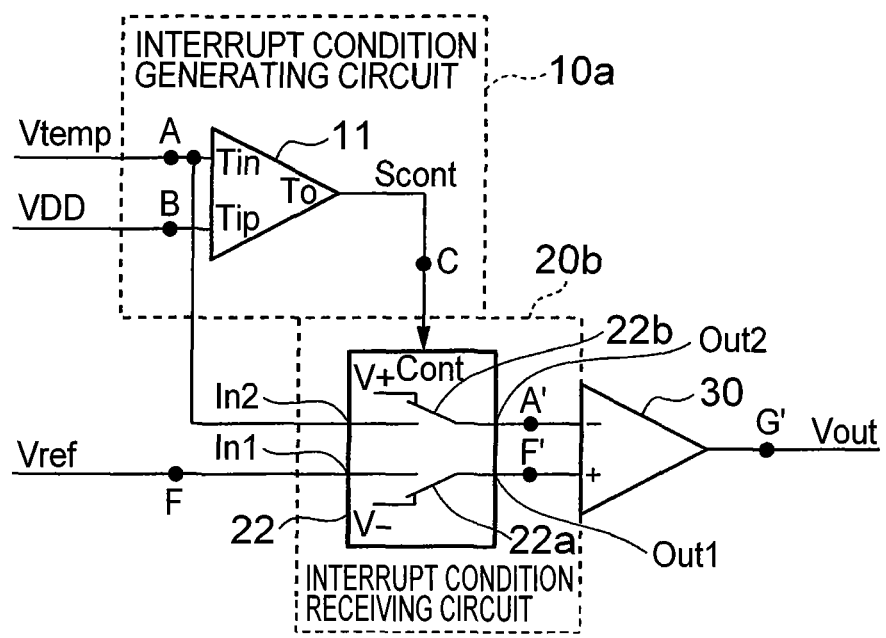
FIG. 19 is a schematic configuration diagram illustrating a detection circuit according to a seventh embodiment of the present invention.

FIG. 19 is a schematic configuration diagram illustrating a detection circuit 500 according to a seventh embodiment of the present invention.

The detection circuit 500 includes the interrupt condition generating circuit 10a, an interrupt condition reception circuit 20b, and the comparator 30. Constituent elements similar to those of FIG. 7 are denoted by the same reference numerals and symbols, and a description is given of constituent elements different from those of FIG. 7.

The interrupt condition reception circuit 20b of the detection circuit 500 includes a selection circuit 22.

The selection circuit 22 includes switches 22a and 22b, which operate in conjunction with a control signal to be input.

The switches 22a and 22b each are connected between each of output terminals Out1 and Out2 and each of input terminals In1 and In2, the output terminals Out1 and Out2 being provided in association with the input terminals In1 and In2. The switches 22a and 22b selectively switch between a predetermined voltage and an input signal input to the input terminals, according to an interrupt signal input to a control input terminal Cont as the control signal Scont, to thereby output one of the predetermined voltage and the input signal. The switches 22a and 22b output predetermined voltages, and the predetermined voltage (V−) output from the switch 22a is set to be lower than the predetermined voltage (V+) output from the switch 22b. In other words, the interrupt condition reception circuit 20b outputs predetermined voltages output via the switches 22a and 22b as output signals, without allowing an input signal to be output, until the interrupt caused by the interrupt signal input as the control signal is released. On the other hand, the interrupt condition reception circuit 20b allows the input signal to be output when the interrupt caused by the interrupt signal is released, and outputs the input signal as an output signal.

Next, a connection state of the detection circuit 500 is described.

The detection circuit 500 receives a power supply for actuating the detection circuit 500, an input of the input signal Vtemp from the sensor circuit (not shown), and an input of the reference voltage Vref output from the reference power source RF (not shown). The interrupt condition generating circuit 10a has the input terminal Tip connected to the positive terminal of a power source, which is applied with the voltage VDD. Further, the input terminal Tin connects to an output terminal of the sensor circuit (not shown). The interrupt condition reception circuit 20b has the input terminal In1 connected to the reference power source RF (not shown) which outputs the reference voltage Vref, the input terminal In2 connected to the output terminal of the sensor circuit (not shown), and the control input terminal Cont connected to an output terminal of the interrupt condition generating circuit 10a. The comparator 30 has the non-inverting input terminal thereof connected to the output terminal Out1 of the interrupt condition reception circuit 20b, and the inverting input terminal thereof connected to the output terminal Out2 of the interrupt condition reception circuit 20b.

Figure 20:
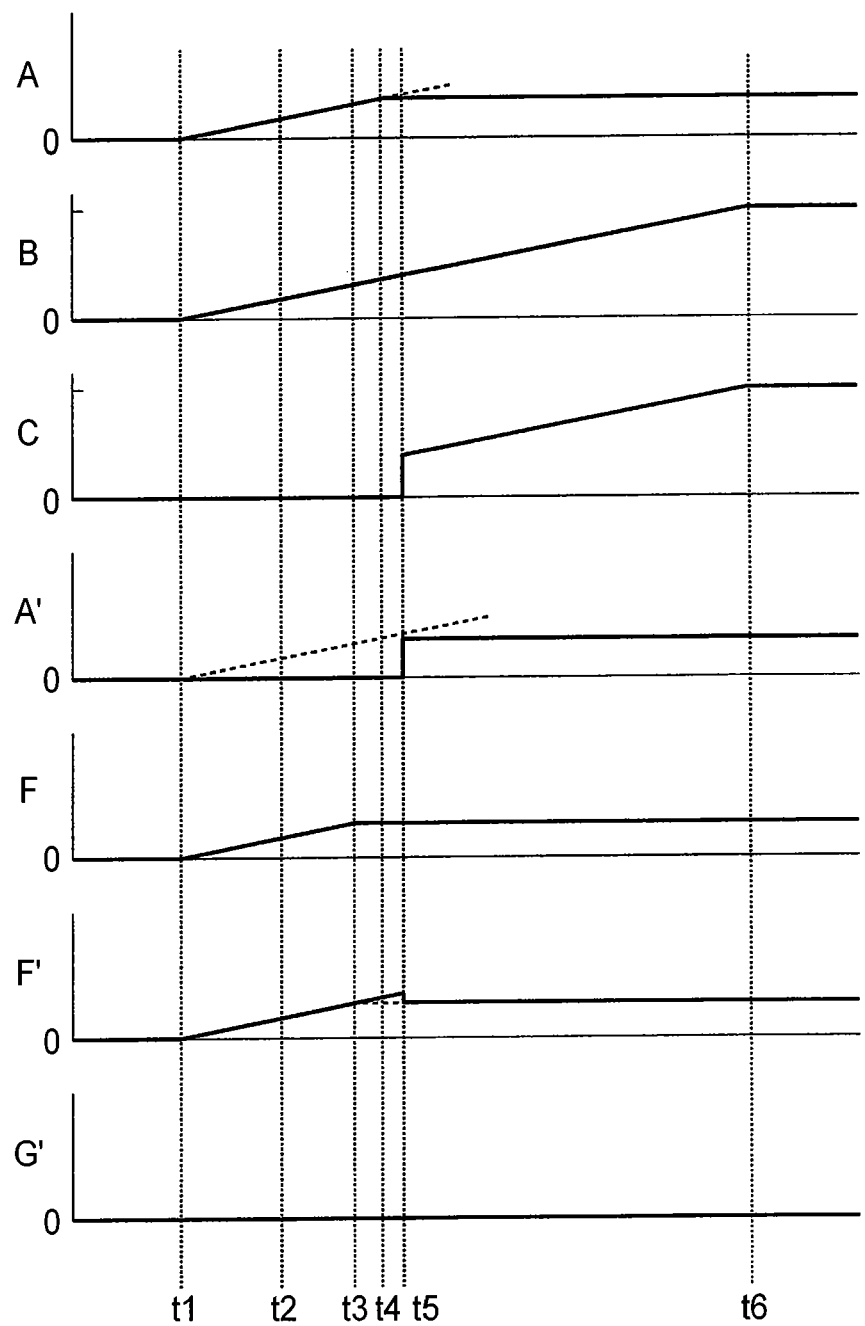
FIG. 20 is a timing chart for illustrating an operation of the detection circuit according to the seventh embodiment.

FIG. 20 is a timing chart for illustrating an operation of the detection circuit 500 according to the seventh embodiment.

With reference to points A, B, C, A', F, F', and G' illustrated in the block diagram of FIG. 19, a signal transition at each of those points is described. The signals and times similar to those of FIG. 8 are denoted by the same reference symbols, and signals and times different from those of FIG. 8 are mainly described. The detection circuit 100 illustrated in FIG. 8 is interpreted as the detection circuit 500.

A waveform at the point A' shows a voltage transition of a signal Sa' output at the point A' in the interrupt condition reception circuit 20b. The signal Sa' may be output as one of a signal the same as the input signal Vtemp input from the sensor circuit and a predetermined voltage set in advance.

A waveform at the point F' shows a voltage transition of a signal Sf' output at the point F' in the interrupt condition reception circuit 20b. The signal Sf' may be output as one of the reference voltage Vref output from the reference power source RF and to be supplied to the detection circuit 500 and a predetermined voltage set in advance.

A waveform at the point G' corresponds to the output signal Vout output from the detection circuit 500 after being subjected to the judgment made by the comparator 30. In the range illustrated in the timing chart, there is occurring no event to be detected by the sensor circuit, and hence the output signal Vout constantly exhibits a low level.

In the initial state illustrated in FIG. 20, the power has not been turned on and no electric charge is accumulated in each of the circuits. Hence, the signals each exhibit a non-signal state.

At the time t1, the detection circuit 500, and the sensor circuit and the reference power source RF, which are connected to the detection circuit 500, are powered on. After that, the power supply voltage VDD gradually increases. The input signal Vtemp and the reference voltage Vref output from the sensor circuit and the reference power source RF, respectively, are equal in voltage to the power supply voltage VDD due to the operation of the current source, in a state where the power supply voltage VDD is low. The input signal Vtemp and the reference voltage Vref also gradually increase, along with the increase in power supply voltage VDD, exhibiting change characteristics similar to the power supply voltage VDD.

The interrupt condition generating circuit 10a makes a judgment on input signals by comparing one of the signals with another, the one of the signals being applied with an offset potential. Accordingly, in the interrupt condition generating circuit 10a, even when the potential difference between the input signals is small, a result of the judgment is output based on the comparison using the potential thus offset, without leading to an unsteady state. As a result, the control signal Scont exhibits a low level.

On the other hand, the comparator 30, which receives a signal input from the interrupt condition reception circuit 20b, performs a process of settling the output signal Vout so as to exhibit a non-detection state (released state) until the power supply voltage VDD reaches a predetermined voltage. The process of settling the signal so as to exhibit the released state is controlled by the control signal Scont. With the control signal Scont exhibiting a low level, the interrupt condition reception circuit 20b outputs predetermined voltages represented by the signals Sf' and Sa', from the output terminals Out1 and Out2, respectively. The interrupt condition reception circuit 20b outputs, as the signal Sf', the voltage (V−) close to the ground voltage VSS, and outputs, as the signal Sa', the voltage (V+) which increases along with the increase in power supply voltage VDD. In this manner, the output signal Vout of the comparator 30 is securely retained to a low level, with the result that a signal which exhibits an unnecessary detection state is not output.

At the time t2, the power supply voltage VDD increases, and the circuits each make a transition to an operation-enabled state.

In the interrupt condition generating circuit 10a, despite a small potential difference between the input signal Vtemp and the power supply voltage VDD, the control signal Scont is settled to a low level because one of the signals is applied with an offset potential. The input signal Vtemp and the reference voltage Vref, which are output from the sensor circuit and the reference power source RF, respectively, gradually increase along with the increase in power supply voltage VDD.

With the control signal Scont being at a low level, the interrupt condition reception circuit 20b and the comparator 30 continue to be in the same state as that of the time t1.

Accordingly, the comparator 30 outputs the output signal Vout retained at a low level, with the result that a signal which exhibits an unnecessary detection state is not output.

At the time t3, the input from the reference power source RF represented by the reference voltage Vref reaches a predetermined voltage and then is subjected to constant voltage control, which allows a constant voltage to be input. The power supply voltage VDD and a potential of the input signal Vtemp from the sensor circuit continue to increase.

The reference voltage Vref exhibits a predetermined voltage while the reference voltage Vref exhibits a potential smaller than that of the input signal Vtemp.

Similar to the state from the time t2 described above, in the interrupt condition generating circuit 10a, despite a small potential difference between the input signal Vtemp and the power supply voltage VDD, the control signal Scont is settled to a low level because one of the signals is applied with an offset potential. An output from the sensor circuit, that is, the input signal Vtemp, gradually increases along with the increase in power supply voltage VDD.

With the control signal Scont being at a low level, the interrupt condition reception circuit 20b and the comparator 30 continue to be in the same state as that of the time t1. Accordingly, the output signal Vout of the comparator 30 is securely retained at a low level, with the result that a signal which exhibits an unnecessary detection state is not output.

At the time t4, the input signal Vtemp from the sensor circuit makes a transition to a stationary operation state which exhibits a predetermined detection state. As a result, the input signal Vtemp is supposed to change according to a state detected by the sensor circuit, and the continued increase in input signal Vtemp along with the increase in power supply voltage VDD stops. Then, the power supply voltage VDD has increased to be higher in voltage value than the input signal Vtemp which is determined based on a current supplied by a constant current circuit provided to the sensor circuit and the impedance of the sensor circuit, and a change based on the input signal Vtemp from the sensor circuit may be detected.

At the time t5, the interrupt condition generating circuit 10a detects a predetermined potential difference occurring between the input signal Vtemp from the sensor circuit and the power supply voltage VDD, that is, a potential difference equal to or larger than the offset potential (bias potential Vb) in the interrupt condition generating circuit 10a. The result of the detection indicates that the power supply voltage VDD has made a transition to a state where an operation-enabled power supply voltage may be supplied to the sensor circuit. In the interrupt condition generating circuit 10a, the control signal Scont is set to an interrupt-released state (high level), and the control signal Scont increases in voltage along with the increase in potential of the power supply voltage VDD.

With the control signal Scont being set to the interrupt-released state (high level), the interrupt condition reception circuit 20b switches to output input signals input to the input terminals. The interrupt condition reception circuit 20b outputs, as the signal Sa', the input signal Vtemp input thereto, and outputs, as the signal Sf', the reference voltage Vref input thereto.

At the time t6, the power supply voltage VDD reaches a predetermined operation-enabled power supply voltage and stops increasing further, and hence the power supply voltage VDD starts to exhibit a constant value. Further, the control signal Scont stops increasing in voltage, and makes a transition to a state where a constant value is exhibited.

As described above, each of the signals makes a state transition when power is turned on. No unnecessary detection signal is output as the output signal Vout until the power supply voltage VDD reaches a predetermined operation-enabled power supply voltage, and the output signal Vout is securely retained at a low level, with the result that a signal which exhibits an unnecessary detection state may not be output.

(Eighth Embodiment)

With reference to the accompanying drawings, another embodiment of the detection circuit which is different in configuration is described.

Figure 21:
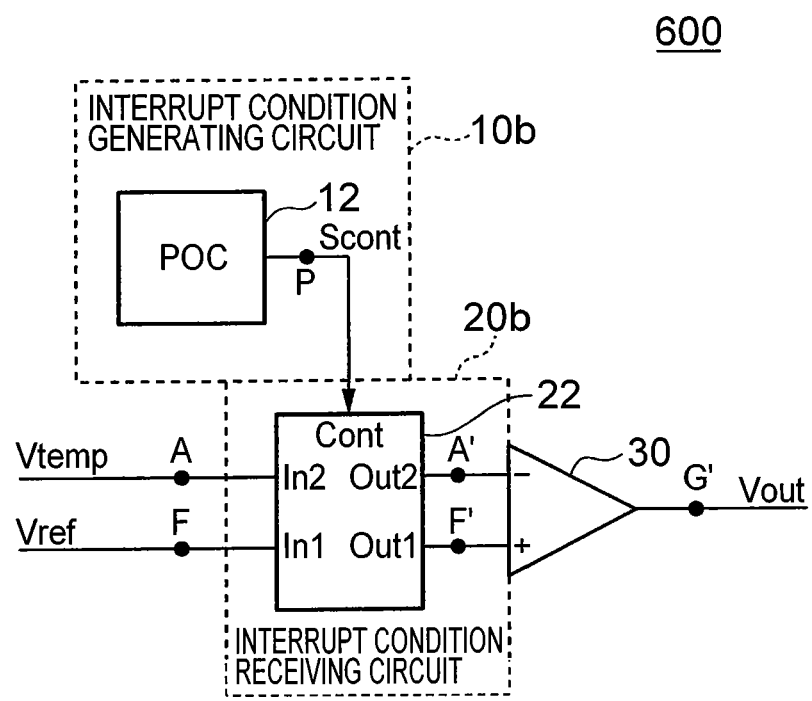
FIG. 21 is a schematic configuration diagram illustrating a detection circuit according to an eighth embodiment of the present invention.

FIG. 21 is a schematic configuration diagram illustrating a detection circuit 600 according to an eighth embodiment of the present invention.

The detection circuit 600 includes the interrupt condition generating circuit 10b, the interrupt condition reception circuit 20b, and the comparator 30. Constituent elements similar to those of FIGS. 7, 9, and 19 are denoted by the same reference numerals and symbols.

Next, a connection state of the detection circuit 600 is described.

The detection circuit 600 receives a power supply for actuating the detection circuit 600, an input of the input signal Vtemp from the sensor circuit (not shown), and an input of the reference voltage Vref output from the reference power source RF (not shown). The interrupt condition reception circuit 20b has the input terminal In1 connected to the positive terminal of the power source (not shown) which outputs the reference voltage Vref (power supply voltage VDD), the input terminal In2 connected to the output terminal of the sensor circuit (not shown), and the control input terminal Cont connected to an output terminal of the interrupt condition generating circuit 10b. The comparator 30 has the non-inverting input terminal thereof connected to the output terminal Out1 of the interrupt condition reception circuit 20b, and the inverting input terminal thereof connected to the output terminal Out2 of the interrupt condition reception circuit 20b.

Figure 22:
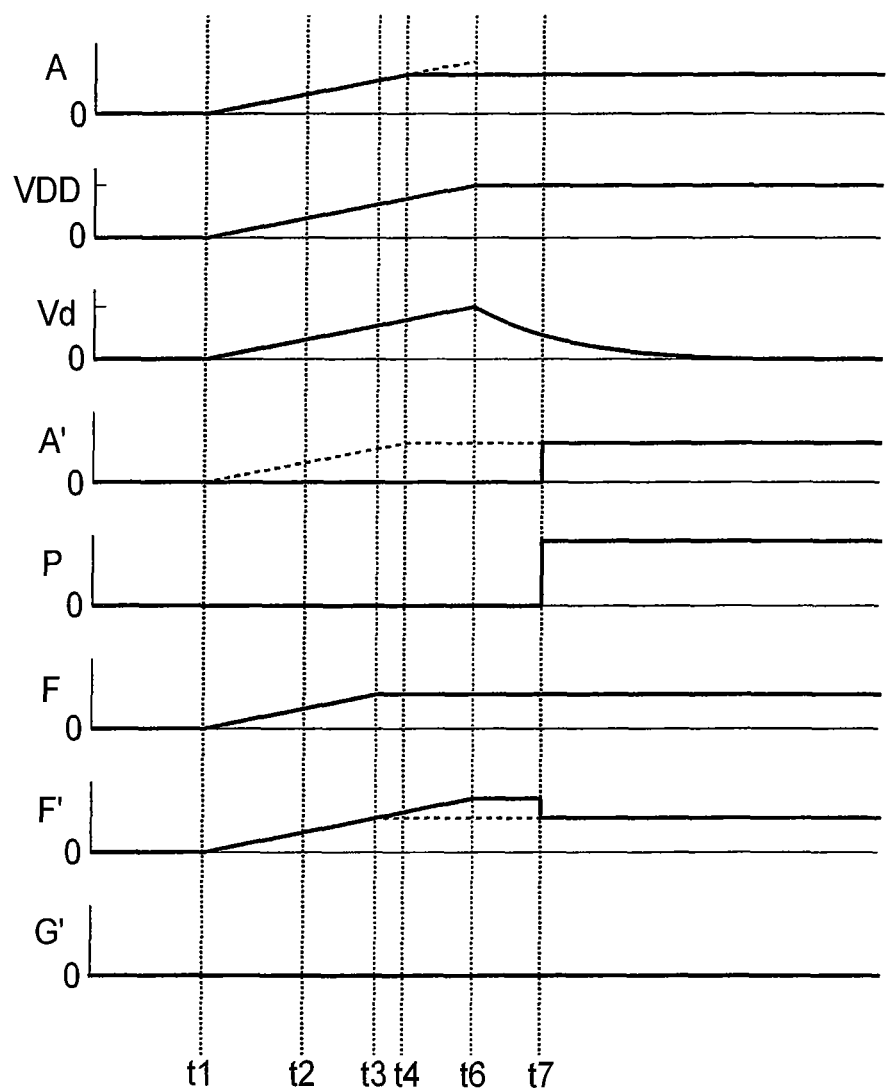
FIG. 22 is a timing chart for illustrating an operation of the detection circuit according to the eighth embodiment.

FIG. 22 is a timing chart for illustrating an operation of the detection circuit 600 according to the eighth embodiment.

With reference to points A, A', F, F', G', Vd, VDD, and P illustrated in the block diagram of FIG. 21, a signal transition at each of those points is described. The signals and times similar to those of FIGS. 8, 10, and 20 are denoted by the same reference symbols, and signals and times different from those of FIGS. 8, 10, and 20 are mainly described. The detection circuit 100 illustrated in FIG. 7, the detection circuit 200 illustrated in FIG. 9, and the detection circuit 500 illustrated in FIG. 19 are interpreted as the detection circuit 600.

In the initial state illustrated in FIG. 22, the power has not been turned on and no electric charge is accumulated in each of the circuits. Hence, the signals each exhibit a non-signal state.

At the time t1, the detection circuit 600, and the sensor circuit and the reference power source RF, which are connected to the detection circuit 600, are powered on. After that, the power supply voltage VDD gradually increases. The input signal Vtemp and the reference voltage Vref output from the sensor circuit and the reference power source RF, respectively, are equal in voltage to the power supply voltage VDD due to the operation of the current source, in a state where the power supply voltage VDD is low. The input signal Vtemp and the reference voltage Vref also gradually increase, along with the increase in power supply voltage VDD, exhibiting change characteristics similar to the power supply voltage VDD.

The POC circuit 12 in the interrupt condition generating circuit 10b detects the power supply voltage VDD. The capacitor 12c and the resistor 12R form the time constant circuit. Due to the time constant circuit, a potential at the point Vd changes according to a transient characteristic with a first order lag which is identified as a step response based on the power supply voltage VDD as an input. The power supply voltage VDD increases following the power-on, but the control signal Scont still exhibits a low level because the inverter 12a has not been actuated.

On the other hand, the comparator 30, which receives a signal input from the interrupt condition reception circuit 20b, performs a process of settling the output signal Vout so as to exhibit a non-detection state (released state) until the power supply voltage VDD reaches a predetermined voltage. The process of settling the signal so as to exhibit the released state is controlled by the control signal Scont. With the control signal Scont exhibiting a low level, the interrupt condition reception circuit 20b outputs predetermined voltages represented by the signals Sf' and Sa', from the output terminals Out1 and Out2, respectively. The interrupt condition reception circuit 20b outputs, as the signal Sf', the voltage (V−) close to the ground voltage VSS, and outputs, as the signal Sa', the voltage (V+) which increases along with the increase in power supply voltage VDD. In this manner, the output signal Vout of the comparator 30 is output at a low level, with the result that a signal which exhibits an unnecessary detection state is not output but a signal which exhibits a released state is output.

At the time t2, the power supply voltage VDD increases, and the circuits each make a transition to an operation-enabled state.

In the POC circuit 12 of the interrupt condition generating circuit 10b, a potential at the point Vd is higher than a threshold potential in the inverter 12a. As the power supply voltage VDD to the inverter 12a transiently increases, the threshold potential of the inverter 12a increases along with the increase in power supply voltage VDD. Accordingly, the control signal Scont is settled to a low level. The input signal Vtemp and the reference voltage Vref output from the sensor circuit and the reference power source RF, respectively, also gradually increase along with the increase in power supply voltage VDD.

With the control signal Scont being at a low level, the interrupt condition reception circuit 20b and the comparator 30 continue to be in the same state as that of the time t1. Accordingly, the comparator 30 outputs the output signal Vout retained at a low level, with the result that a signal which exhibits an unnecessary detection state is not output.

At the time t3, the reference voltage Vref input from the reference power source RF reaches a predetermined voltage and then is subjected to constant voltage control, which allows a constant voltage to be input. The power supply voltage VDD and a potential of the input signal Vtemp from the sensor circuit continue to increase.

The reference voltage Vref exhibits a predetermined voltage while the reference voltage Vref exhibits a potential smaller than that of the input signal Vtemp. Similar to the state from the time t2 described above, in the interrupt condition generating circuit 10b, no state transition occurs, and the control signal Scont is output at a low level. An output from the sensor circuit, that is, the input signal Vtemp, gradually increases along with the increase in power supply voltage VDD. With the control signal Scont being at a low level, the interrupt condition reception circuit 20b and the comparator 30 continue to be in the same state as that of the time t1. Accordingly, the output signal Vout of the comparator 30 is securely retained at a low level, with the result that a signal which exhibits an unnecessary detection state is not output.

At the time t4, the input signal Vtemp from the sensor circuit makes a transition to a stationary operation state which exhibits a predetermined detection state. As a result, the input signal Vtemp is supposed to change according to a state detected by the sensor circuit, and the continued increase in input signal Vtemp along with the increase in power supply voltage VDD stops.

At the time t6, the power supply voltage VDD reaches a predetermined operation-enabled power supply voltage and stops increasing further, thereby starting to exhibit a constant value. Further, the control signal Scont stops increasing, and makes a transition to a state where a constant value is exhibited. In the POC circuit 12 of the interrupt condition generating circuit 10b, a potential increase at the point Vd stops and the potential starts to decline.

At the time t7, in the POC circuit 12 of the interrupt condition generating circuit 10b, when a potential at the point Vd is reduced to be equal to or lower than the threshold voltage of the inverter 12a, the control signal Scont makes a transition to a high level. The interrupt condition generating circuit 10b releases the interrupt state (low level) set to the control signal that has been output as the control signal Scont, and outputs a signal at a high level exhibiting an interrupt-released state.

The comparator 30, which is to receive a signal input from the interrupt condition reception circuit 20b, receives an input of a signal, which has been input to the interrupt condition reception circuit 20b, via the interrupt condition reception circuit 20b. The comparator 30 performs a process of settling the output signal Vout so as to exhibit a released state until the power supply voltage VDD reaches a predetermined voltage. The process of settling the signal so as to exhibit the released state is controlled by the control signal Scont, which is input as a control signal. With the control signal Scont exhibiting a high level, the interrupt condition reception circuit 20b outputs the signals Sf' and Sa' from the output terminals Out1 and Out2, respectively. The signals correspond to the reference voltage Vref and the input signal Vtemp, respectively. As a result, the detection circuit 600 makes a transition to a normal state capable of outputting a detection signal.

As described above, each of the signals makes a state transition when power is turned on. The output signal Vout is securely retained at a low level until the power supply voltage VDD reaches a predetermined operation-enabled power supply voltage, with the result that a signal which exhibits an unnecessary detection state may not be output.

(Ninth Embodiment)

The detection circuit (any one of the detection circuit 100 to the detection circuit 600) illustrated in the first to seventh embodiments may form, when combined with a sensor 900, a desired sensor device.

The sensor 900 may be implemented by various sensors, such as a temperature sensor, a magnetic resistant (MR) sensor, and a BGR sensor. The sensor 900 may be formed by combining a constant current circuit connected to a positive terminal of a power source (power supply voltage VDD) with an impedance circuit which serves as a load in the constant current circuit. The impedance circuit may be selected as a device which changes in impedance according to the scale of a detected event, depending on the intended use of the sensor. With this configuration, even in the operation after power is turned on, an erroneous detection signal due to the power-on may be prevented from being output as the output signal. As a result, a sensor device high in reliability may be formed.

In general, a conventional detection circuit and a conventional sensor device do not have a configuration capable of making the operation-enabled state known outside by its own. In the power supply voltage monitoring circuit provided to the detection circuit and the sensor device described above, the power supply voltage VDD may not be used efficiently, which hinders the minimum operation voltage from being lowered. When the present invention is applied thereto, the above-mentioned problem may also be solved.

In the above, the embodiments of the present invention have been described. However, the power supply voltage monitoring circuit according to the present invention, and the detection circuit, the sensor device, and the electronic circuit which are applications of the power supply voltage monitoring circuit according to the present invention may not be limited to the examples described above as illustrated in the drawings, and may obviously be subjected to various modifications without departing from the gist of the present invention.

What is claimed is:

1. A power supply voltage monitoring circuit for monitoring a power supply voltage supplied to an electronic circuit, comprising:
    a signal output circuit for outputting a signal voltage which exhibits a saturation characteristic with respect to an increase in the power supply voltage, wherein the signal output circuit outputs, when power is turned on, a signal voltage which increases along with an increase in the power supply voltage until the power supply voltage makes a transition to a predetermined voltage, and outputs a voltage which monotonously increases and has a saturation characteristic in a case where the power supply voltage continues to increase after exceeding the predetermined voltage; and
    a signal voltage monitoring circuit for comparing the power supply voltage with the signal voltage, and for outputting a signal indicating that the signal voltage is normal when there is a predetermined voltage difference between the power supply voltage and the signal voltage; wherein, the signal voltage monitoring circuit compares the signal voltage output from the signal output circuit with the power supply voltage, and outputs a signal indicating that the power supply voltage has exceeded a minimum operating power supply voltage of the electronic circuit when there is the predetermined voltage difference between the power supply voltage and the signal voltage.

2. A power supply voltage monitoring circuit according to claim 1, wherein:
    the signal output circuit includes an impedance circuit supplied with current from a power source via a current supply circuit, generates the signal voltage through the impedance circuit, and outputs the signal voltage thus generated; and
    the signal voltage monitoring circuit outputs a signal indicating that the power supply voltage has become equal to or larger than a minimum operating power supply voltage of the electronic circuit when there is the predetermined voltage difference between the power supply voltage and the signal voltage.

3. A power supply voltage monitoring circuit according to claim 2, wherein the signal output circuit generates the signal voltage through the impedance circuit, as a reference voltage to be compared with the power supply voltage and further as a voltage which exhibits temperature dependence, and outputs the signal voltage thus generated.

4. A power supply voltage monitoring circuit according to claim 1, wherein the signal voltage monitoring circuit comprises a comparison circuit which sets an offset potential as one of two signals input thereto, and outputs a signal indicating that the power supply voltage has exceeded a minimum operating power supply voltage in a case where a potential difference between the two signals satisfies the offset potential.

5. A power supply voltage monitoring circuit according to claim 1, wherein the signal output circuit comprises a current supply circuit and an impedance circuit, which are connected in series, and outputs the signal voltage from a circuit connection point between the current supply circuit and the impedance circuit.

6. A power supply voltage monitoring circuit according to claim 5, wherein the impedance circuit comprises a sensor for inputting a current output from the current supply circuit and for outputting a voltage signal corresponding to detected physical quantities.

7. A power supply voltage monitoring circuit according to claim 6, wherein the sensor comprises a temperature sensor for detecting temperatures.

8. An electronic circuit, comprising the power supply voltage monitoring circuit according to claim 1.

* * * * *